United States Patent
Tsuda et al.

(10) Patent No.: US 10,593,694 B2
(45) Date of Patent: Mar. 17, 2020

(54) METHOD FOR MANUFACTURING SEMICONDUCTOR MEMORY DEVICE AND SEMICONDUCTOR MEMORY DEVICE

(71) Applicant: Toshiba Memory Corporation, Tokyo (JP)

(72) Inventors: Hirotaka Tsuda, Tokyo (JP); Yusuke Oshiki, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/162,667

(22) Filed: Oct. 17, 2018

(65) Prior Publication Data

US 2019/0051663 A1 Feb. 14, 2019

Related U.S. Application Data

(60) Continuation of application No. 15/440,025, filed on Feb. 23, 2017, now Pat. No. 10,141,329, which is a division of application No. 14/639,084, filed on Mar. 4, 2015, now Pat. No. 9,627,401.

(30) Foreign Application Priority Data

Oct. 30, 2014 (JP) ................................. 2014-221032

(51) Int. Cl.
| | |
|---|---|
| *H01L 27/11582* | (2017.01) |
| *H01L 21/311* | (2006.01) |
| *H01L 21/02* | (2006.01) |
| *H01L 27/11565* | (2017.01) |
| *H01L 29/66* | (2006.01) |
| *H01L 29/792* | (2006.01) |

(52) U.S. Cl.
CPC .... *H01L 27/11582* (2013.01); *H01L 21/0217* (2013.01); *H01L 21/02164* (2013.01); *H01L 21/31111* (2013.01); *H01L 21/31116* (2013.01); *H01L 27/11565* (2013.01); *H01L 29/66833* (2013.01); *H01L 29/7926* (2013.01); *H01L 21/31144* (2013.01)

(58) Field of Classification Search
None
See application file for complete search history.

(56) References Cited

U.S. PATENT DOCUMENTS

| | | |
|---|---|---|
| 8,569,826 B2 | 10/2013 | Kidoh et al. |
| 8,575,681 B2 | 11/2013 | Matsuda et al. |
| 8,617,979 B2 | 12/2013 | Ide |

(Continued)

FOREIGN PATENT DOCUMENTS

| | | |
|---|---|---|
| JP | 2012-4470 A | 1/2012 |
| JP | 2016-171280 A | 9/2016 |

*Primary Examiner* — Long Pham
(74) *Attorney, Agent, or Firm* — Finnegan, Henderson, Farabow, Garrett & Dunner, L.L.P.

(57) ABSTRACT

According to one embodiment, a method for manufacturing a semiconductor memory device includes simultaneously forming a plurality of first holes and a plurality of second holes in a stacked body. The stacked body includes a plurality of first layers and a plurality of second layers. The method includes etching a portion between the second holes next to each other in the stacked body, and connecting at least two or more second holes to form a groove. The method includes forming a film including a charge storage film on a sidewall of the first holes. The method includes forming a channel film on a sidewall of the film including the charge storage film.

20 Claims, 21 Drawing Sheets

(56) References Cited

U.S. PATENT DOCUMENTS

| | | |
|---|---|---|
| 8,753,977 B2 | 6/2014 | Ide |
| 8,803,222 B2 | 8/2014 | Lee et al. |
| 8,890,235 B2 | 11/2014 | Kidoh et al. |
| 9,230,984 B1 | 1/2016 | Takeguchi |
| 2011/0039415 A1 | 2/2011 | Liu |
| 2011/0309431 A1 | 12/2011 | Kidoh et al. |
| 2012/0208347 A1 | 8/2012 | Hwang |
| 2012/0211893 A1 | 8/2012 | Ide |
| 2013/0126959 A1 | 5/2013 | Aburada et al. |
| 2013/0221423 A1 | 8/2013 | Kawasaki et al. |
| 2014/0021531 A1 | 1/2014 | Kidoh et al. |
| 2014/0141620 A1 | 5/2014 | Ide |
| 2014/0263169 A1 | 9/2014 | Lee |
| 2015/0001460 A1 | 1/2015 | Kim et al. |
| 2016/0071870 A1 | 3/2016 | Minami et al. |
| 2016/0276363 A1 | 9/2016 | Fukuzumi et al. |

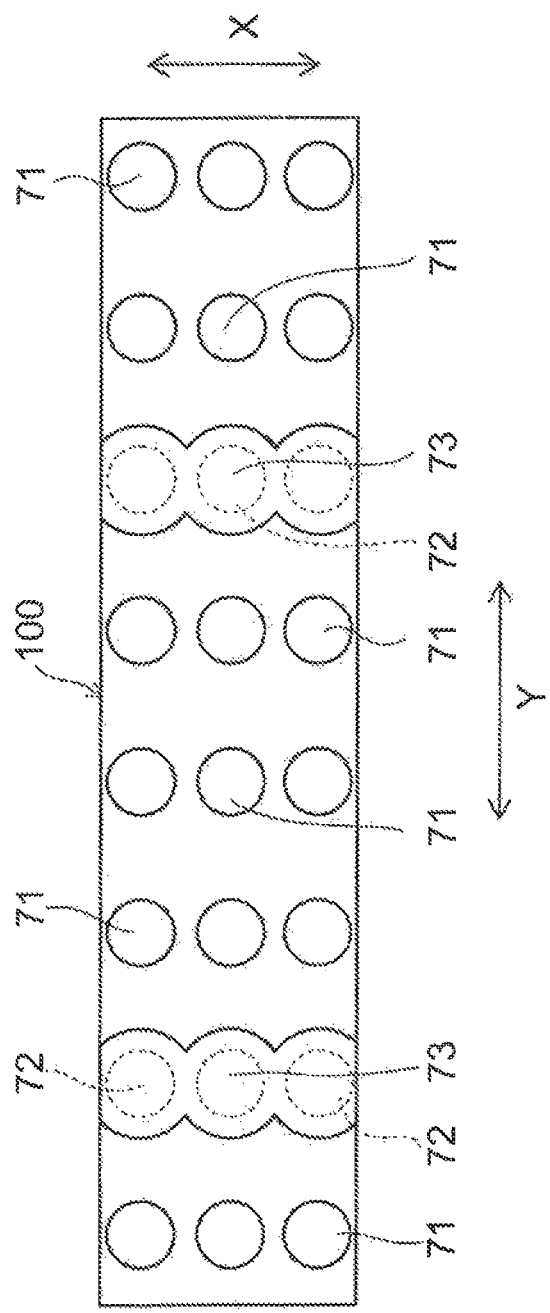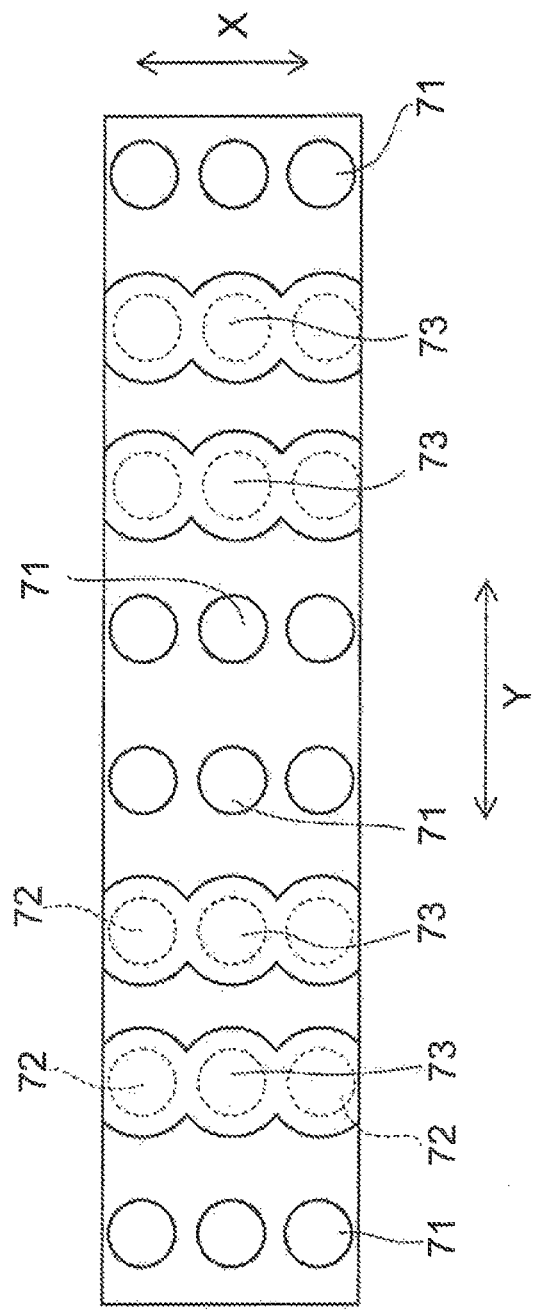

METHOD FOR MANUFACTURING SEMICONDUCTOR MEMORY DEVICE AND SEMICONDUCTOR MEMORY DEVICE

CROSS-REFERENCE TO RELATED APPLICATION

This application is a continuation of application Ser. No. 15/440,025, filed Feb. 23, 2017, which is a divisional, of application Ser. No. 14/639,084, filed Mar. 4, 2015 (now U.S. Pat. No. 9,627,401, issued Apr. 18, 2017) which is based upon and claims the benefit of priority from Japanese Patent Application No. 2014-221032, filed on Oct. 30, 2014. The entire contents of each of these applications are incorporated herein by reference.

FIELD

Embodiments described herein relate generally to a method for manufacturing a semiconductor memory device and a semiconductor memory device.

BACKGROUND

A memory device having a three-dimensional structure is proposed. In the memory device, a memory hole is formed in a stacked body having a plurality of electrode layers functioning as control gates in memory cells stacked in the stacked body with insulating layers interposed between the electrode layers, and a silicon body serving as a channel is provided on a sidewall of the memory hole with a charge storage film interposed between the sidewall and the silicon body.

In a method for manufacturing a memory cell array having such a three-dimensional structure, a technique for forming holes and grooves in the stacked body having different kinds of materials alternately stacked therein is required.

However, when the number of electrode layers stacked increases, particularly, with an increase in storage capacity, and aspect ratios of the holes and the grooves increase, the degree of processing difficulty becomes larger, and further technology development is required.

BRIEF DESCRIPTION OF THE DRAWINGS

FIGS. 9 to 24 are schematic sectional views showing a method for manufacturing the semiconductor memory device of the embodiment.

DETAILED DESCRIPTION

Figure 1:
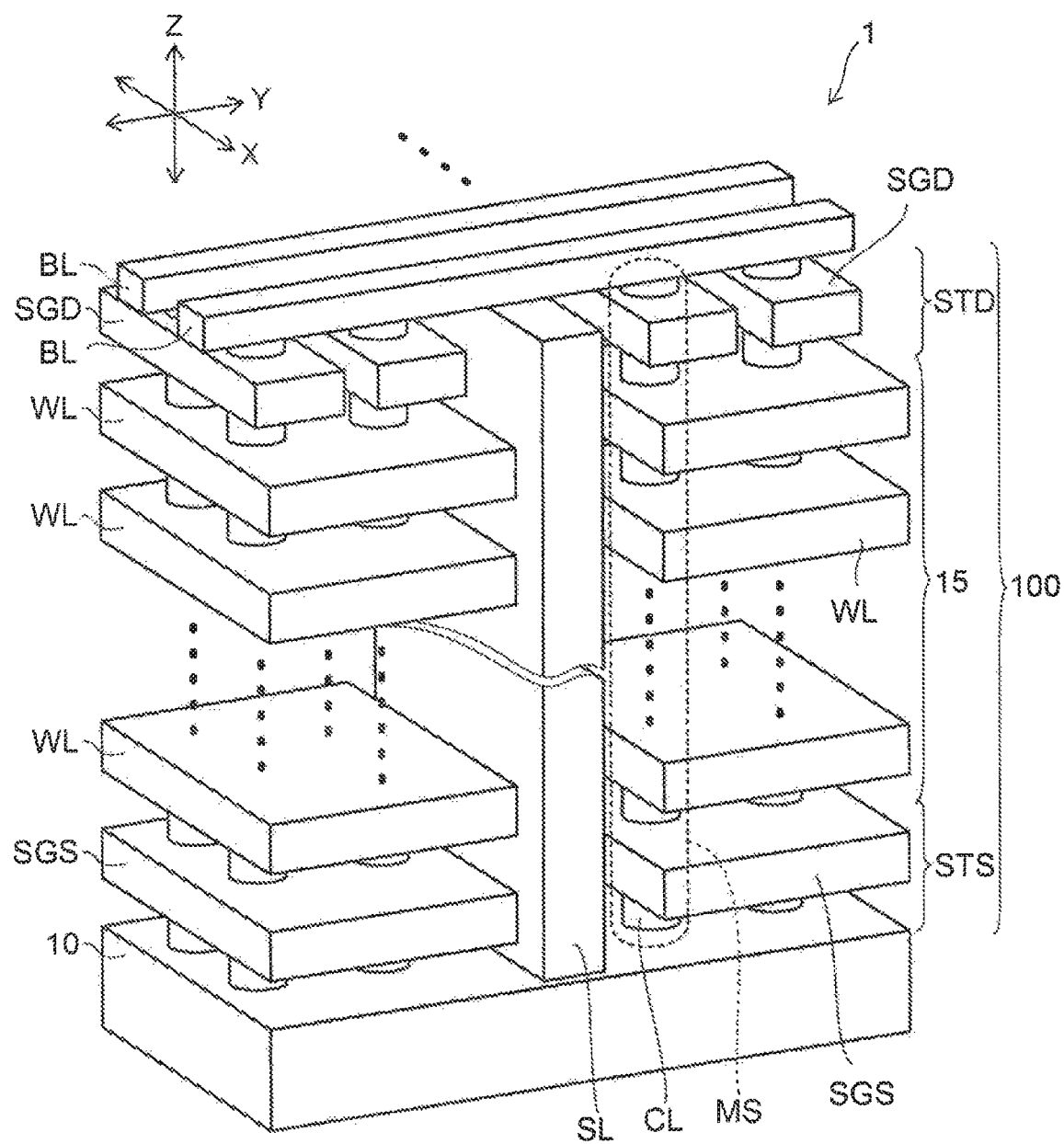
FIG. 1 is a schematic perspective view of a semiconductor memory device of an embodiment.

According to one embodiment, a method for manufacturing a semiconductor memory device includes simultaneously forming a plurality of first holes and a plurality of second holes in a stacked body. The first holes and the second holes are periodically arrayed. The stacked body includes a plurality of first layers and a plurality of second layers. Each of the second layers is provided between the first layers. The method includes etching a portion between the second holes next to each other in the stacked body, and connecting at least two or more second holes to form a groove. The method includes forming a film including a charge storage film on a sidewall of the first holes. The method includes forming a channel film on a sidewall of the film including the charge storage film.

Hereinafter, an embodiment will be described with reference to the accompanying drawings. Meanwhile, in each of the drawings, the same components are denoted by the same reference numerals and signs.

FIG. 1 is a schematic perspective view illustrating a memory cell array 1 of an embodiment. Meanwhile, in FIG. 1, an insulating layer is not shown in order to make the drawing easier to understand.

In FIG. 1, two directions which are directions parallel to the main surface of a substrate 10 and are orthogonal to each other are set to an X-direction (first direction) and a Y-direction (second direction), and a Z-direction (third direction, or stacking direction) is set to a direction which is orthogonal to the X-direction and the Y-direction.

Figure 2:
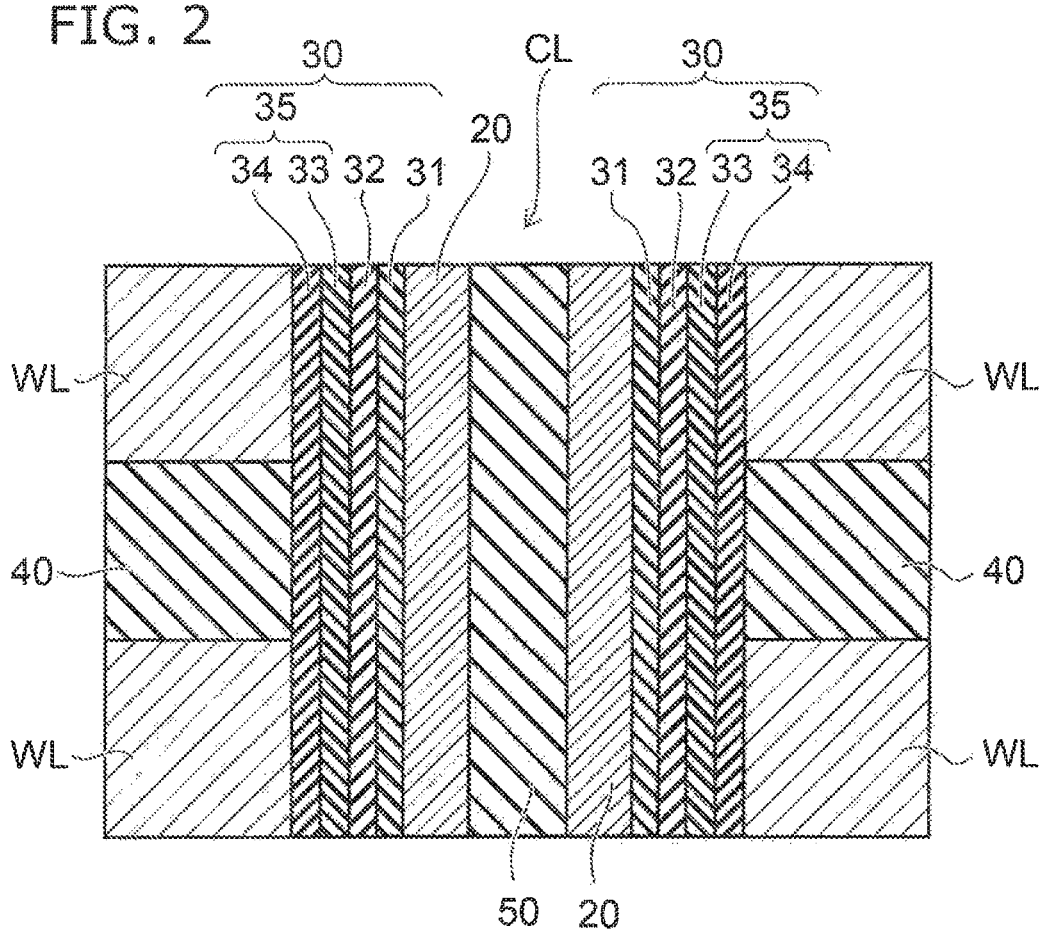
FIG. 2 is an enlarged schematic sectional view of a part of the semiconductor memory device of the embodiment.

A source side select gate (lower gate layer) SGS is provided on the substrate 10 with an insulating layer interposed between the source side select gate SGS and the substrate 10. A stacked body 15 is provided on the source side select gate SGS. The stacked body 15 has electrode layers WL and insulating layers alternately stacked on the stacked body 15. The stacked body 15 includes a plurality of electrode layers WL which are stacked with insulator interposed between the electrode layers WL. The insulator may include voids. As shown in FIG. 2, an insulating layer 40 is provided between the electrode layer WL and the electrode layer WL. A drain side select gate (upper gate layer) SGD is provided on an uppermost electrode layer WL with the insulating layer 40 interposed between the drain side select gate SGD and the uppermost electrode layer WL.

The source side select gate SGS, the drain side select gate SGD, and the electrode layer WL are metal layers (for example, layers containing tungsten as a main component). Alternatively, the source side select gate SGS, the drain side select gate SGD, and the electrode layer WL are, for example, silicon layers containing silicon as a main component, and the silicon layers are doped with, for example, boron as an impurity for giving a conductive property.

Alternatively, the source side select gate SGS, the drain side select gate SGD, and the electrode layer WL may include metal silicide.

A plurality of bit lines BL (metal films) are provided on the drain side select gate SGD with an insulating layer interposed between the bit lines BL and the drain side select gate SGD.

The drain side select gate SGD is separated into a plurality of portions in the Y-direction, corresponding to a row of a plurality of columnar portions CL which are arrayed in the X-direction, and each drain side select gate SGD extends in the X-direction. The bit lines BL are separated into a plurality of portions in the X-direction, corresponding to the row of the plurality of columnar portions CL which are arrayed in the Y-direction, and each bit line BL extends in the Y-direction.

The plurality of columnar portions CL penetrates a stacked body 100. The stacked body 100 includes the source side select gate SGS, the stacked body 15 including the plurality of electrode layers WL, and the drain side select gate SGD. The columnar portion CL extends in the stacking direction (Z-direction) of the stacked body 100. The columnar portion CL is formed, for example, in a cylindrical or elliptic cylindrical shape. The stacked body 100 is separated into a plurality of portions in the Y-direction. A separation portion is provided with, for example, a source layer SL as a conductive layer. The separation portion separates regions having the plurality of columnar portions CL periodically arrayed therein, in the Y-direction.

Figure 19:
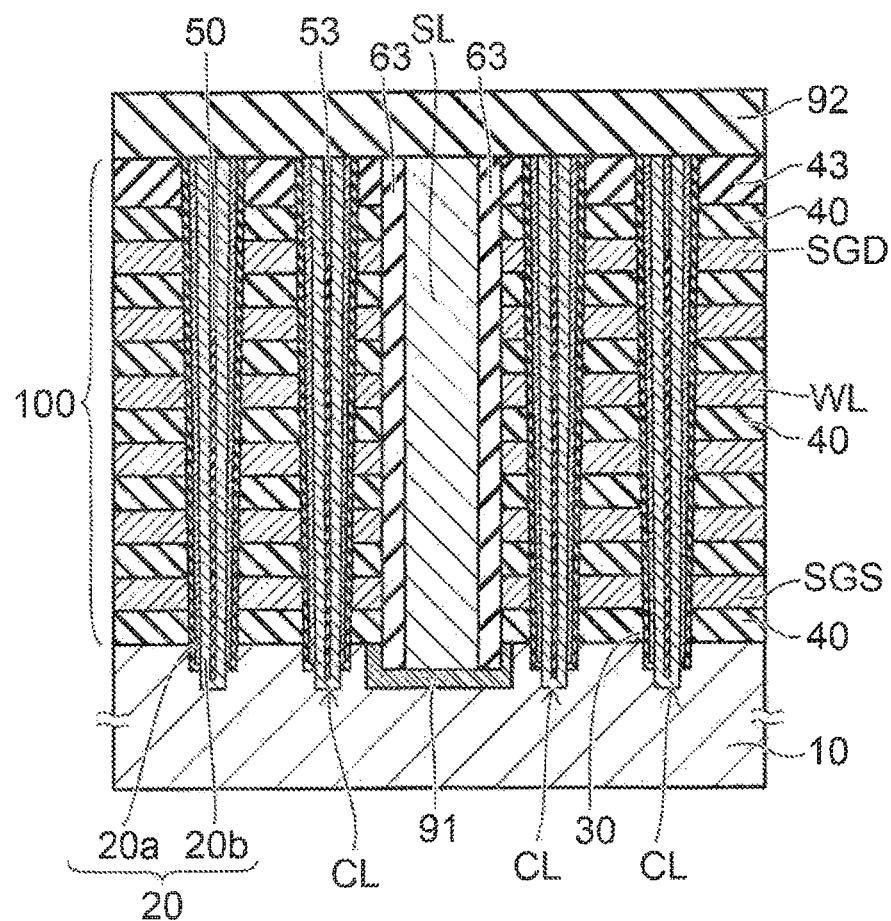

The source layer SL includes a metal (for example, tungsten). The lower end of the source layer SL is connected to the substrate 10. The upper end of the source layer SL is connected to an upper-layer interconnect which is not shown in the drawing. Insulating films 63 shown in FIG. 19 are provided between the source layer SL and the electrode layer WL, between the source layer SL and the source side select gate SGS, and between the source layer SL and the drain side select gate SGD.

FIG. 2 is an enlarged schematic cross-sectional view illustrating a portion of the columnar portion CL.

The columnar portion CL is provided within a memory hole (first hole) which is formed in the stacked body 100. The columnar portion CL includes a channel film (semiconductor film) 20. The channel film 20 is, for example, a silicon film containing silicon as a main component. The channel film 20 substantially does not include impurities.

The channel film 20 is formed in a cylindrical shape extending in the stacking direction of the stacked body 100. The upper end of the channel film 20 penetrates the drain side select gate SGD, and is connected to the bit line BL shown in FIG. 1.

The lower end of the channel film 20 and the lower end of the source layer SL are in contact with the substrate 10. The lower end of the channel film 20 is electrically connected to the source layer SL through the substrate 10.

A memory film 30 is provided between the sidewall of the memory hole and the channel film 20. The memory film 30 includes a block insulating film 35, a charge storage film 32 and a tunnel insulating film 31. The memory film 30 is formed in a cylindrical shape extending in the stacking direction of the stacked body 100.

The block insulating film 35, the charge storage film 32 and the tunnel insulating film 31 are provided between the electrode layer WL and the channel film 20 in this order from the electrode layer WL side. The block insulating film 35 is in contact with the electrode layer WL, the tunnel insulating film 31 is in contact with the channel film 20, and the charge storage film 32 is provided between the block insulating film 35 and the tunnel insulating film 31.

The memory film 30 surrounds the outer circumference of the channel film 20. The electrode layer WL surrounds the outer circumference of the channel film 20 with the memory film 30 interposed between the electrode layer WL and the channel film 20. A core insulating film 50 is provided on the inner side of the channel film 20.

The electrode layer WL functions as a control gate of a memory cell. The charge storage film 32 functions as a data memory layer that stores charge which is injected from the channel film 20. A memory cell having a vertical transistor structure in which the control gate surrounds the channel film 20 is formed at an intersecting portion between the channel film 20 and each electrode layer WL.

The semiconductor memory device of the embodiment is a non-volatile semiconductor memory device in which electrical erasure and writing of data can be freely performed and memory content can be held even when a power supply is cut off.

The memory cell is, for example, a charge trapping memory cell. The charge storage film 32 has a large number of trap sites that trap charge, and includes, for example, a silicon nitride film.

The tunnel insulating film 31 serves as a potential barrier when charge is injected into the charge storage film 32 from the channel film 20, or charge stored in the charge storage film 32 is diffused into the channel film 20. The tunnel insulating film 31 includes, for example, a silicon oxide film. As the tunnel insulating film 31, a stacked film (ONO film) having a structure in which a silicon nitride film is interposed between a pair of silicon oxide films may be used. When the ONO film is used as the tunnel insulating film 31, an erasure operation with a lower electric field can be performed than in the single layer of the silicon oxide film.

The block insulating film 35 prevents the charge stored in the charge storage film 32 from being diffused into the electrode layer WL. The block insulating film 35 includes a cap film 34 which is provided so as to be in contact with the electrode layer WL, and a block film 33 which is provided between the cap film 34 and the charge storage film 32.

The block film 33 is, for example, a silicon oxide film. The cap film 34 is a film having a dielectric constant higher than that of the silicon oxide film, and is, for example, a silicon nitride film, an aluminum oxide film, a hafnium oxide film, an yttrium oxide film or the like. Such a cap film 34 is provided so as to be in contact with the electrode layer WL, and thus it is possible to suppress the creation of back-tunneling electrons which are injected from the electrode layer WL during erasure.

As shown in FIG. 1, a drain side select transistor STD is provided on the upper end of the columnar portion CL, and a source side select transistor STS is provided on the lower end thereof. The memory cell, the drain side select transistor STD, and the source side select transistor STS are vertical transistors in which a current flows in the stacking direction (Z-direction) of the stacked body 100.

The drain side select gate SGD functions as the gate electrode (control gate) of the drain side select transistor STD. An insulating film functioning as a gate insulating film of the drain side select transistor STD is provided between the drain side select gate SGD and the channel film 20.

The source side select gate SGS functions as the gate electrode (control gate) of the source side select transistor STS. An insulating film functioning as a gate insulating film of the source side select transistor STS is provided between the source side select gate SGS and the channel film 20.

A plurality of memory cells in which the electrode layer WL of each layer is used as a control gate are provided between the drain side select transistor STD and the source side select transistor STS. The plurality of memory cells, the drain side select transistor STD and the source side select transistor STS are connected in series to each other through the channel film 20, and constitute one memory string MS. A plurality of memory strings MS are arrayed in the X-direction and the Y-direction, and thus the plurality of memory cells are provided three-dimensionally in the X-direction, the Y-direction and the Z-direction.

Next, a method for manufacturing the semiconductor memory device of the embodiment will be described with reference to FIGS. 3 to 19.

Figure 3:
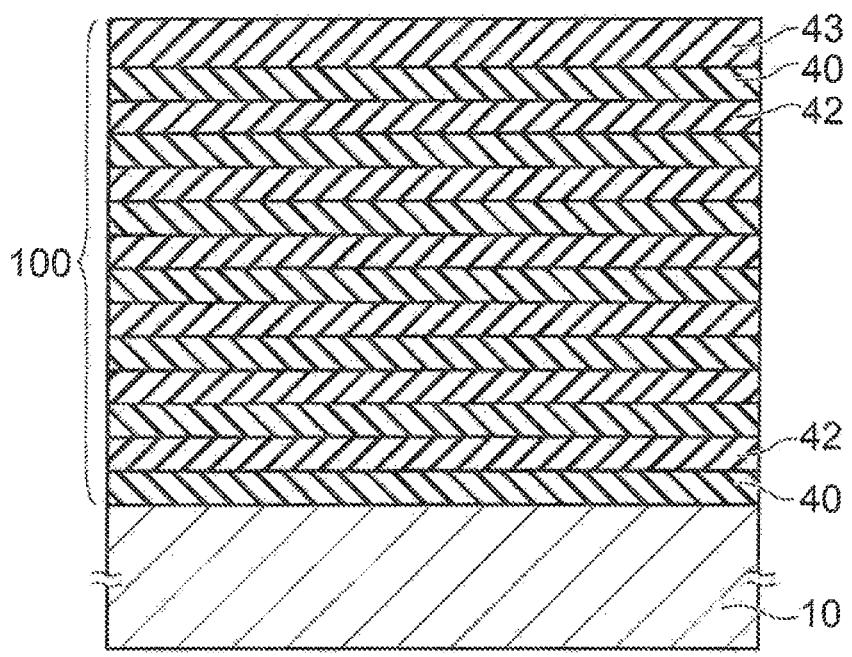
FIG. 3 is a schematic sectional view showing a method for manufacturing the semiconductor memory device of the embodiment.

As shown in FIG. 3, the stacked body 100 is formed on the substrate 10. The stacked body 100 includes a plurality of sacrificial layers (first layers) 42 and a plurality of insulating layers (second layers) 40. The substrate 10 is, for example, a semiconductor substrate and a silicon substrate.

A process of alternately forming the insulating layer 40 and the sacrificial layer 42 on the substrate 10 is repeated multiple times. The number of stacked layers of the insulating layer 40 and the sacrificial layer 42 is not limited to the number of layers illustrated in the drawing. The insulating layer 40 is formed between the substrate 10 and a lowermost sacrificial layer 42.

The insulating layer 40 is, for example, a silicon oxide layer ($SiO_2$ layer). The sacrificial layer 42 is a layer formed of a material different from that of the insulating layer 40, and is, for example, a silicon nitride layer. The sacrificial layer 42 is replaced with a conductive layer (select gate SGS, SGD, electrode layer WL) in the subsequent process.

An insulating layer 43 is formed on an uppermost insulating layer 40. The insulating layer 43 is, for example, a silicon oxide layer (tetra ethoxy silane (TEOS) layer).

Figure 4A:
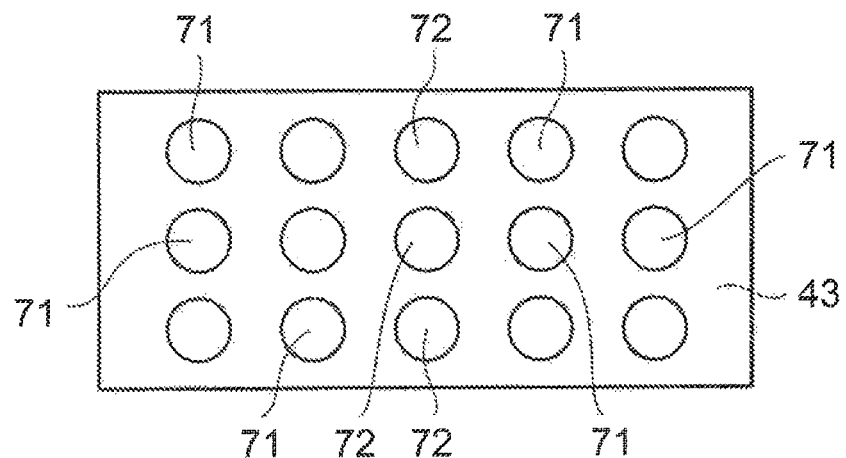
FIG. 4A is a schematic plan view showing a method for manufacturing the semiconductor memory device of the embodiment.
Figure 4B:
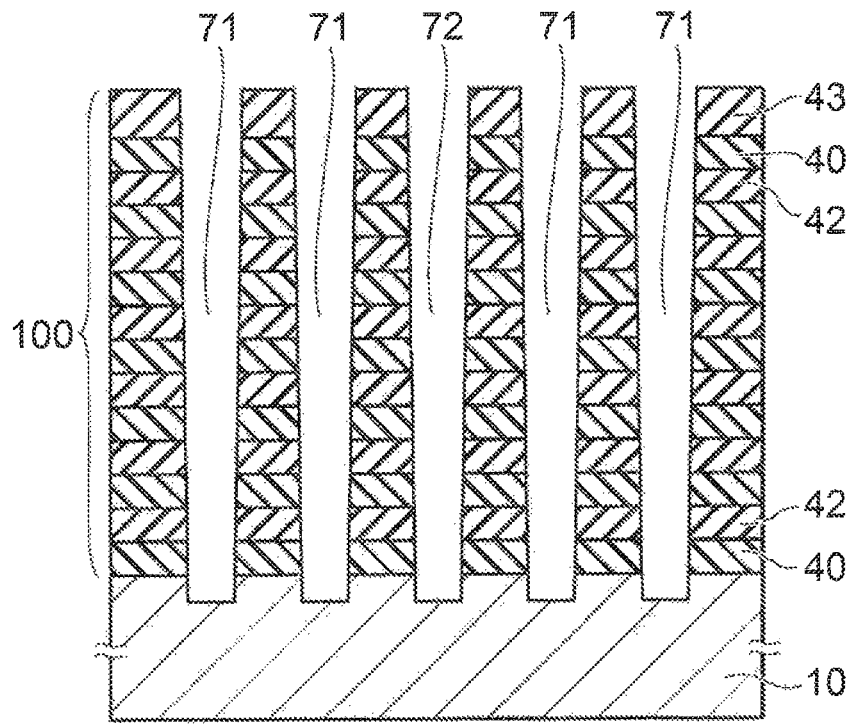
FIG. 4B is a schematic sectional view showing the method for manufacturing the semiconductor memory device of the embodiment.

As shown in FIGS. 4A and 4B, a plurality of holes 71 and 72 are formed in the stacked body 100. FIG. 4A corresponds to the top view of FIG. 4B.

A plurality of first holes 71 and a plurality of second holes 72 are simultaneously formed by a reactive ion etching (RIE) method using a mask which is not shown. The first hole 71 and the second hole 72 reach the substrate 10 through the stacked body 100. The diameter of each of the plurality of first holes 71 and the diameter of each of the plurality of second holes 72 are substantially equal to each other.

The first hole 71 is formed at a region at which the columnar portion CL is provided. According to the example illustrated in FIG. 1, the source layer SL is formed in the separation portion separating the stacked body 100 into a plurality of blocks. The second hole 72 is formed at a region at which the separation portion (source layer SL) is provided.

The insulating layers 43 and 40 and the sacrificial layer 42 are etched non-selectively continuously using the same gas (for example, gas containing a fluorocarbon or a hydrofluorocarbon).

The first hole 71 and the second hole 72 are periodically arrayed over the entire region at which the memory cell array 1 is provided, with a pattern having a high symmetry without coarseness and fineness. For example, the first hole 71 and the second hole 72 may be disposed in a lattice shape and in zigzags.

The columnar portion CL is not formed in the separation portion. For this reason, normally, holes are not formed in the separation portion. In that case, a plurality of holes (memory holes) are arrayed at a region including the columnar portion CL in the memory cell array region, and holes are not formed in a region including the separation portion. Therefore, a plurality of holes are disposed non-uniformly (asymmetrically) with coarseness and fineness.

Particularly, in RIE for forming holes having a high aspect ratio, when the symmetry of an arrangement pattern of the plurality of holes is low, the erosion of a mask layer may be generated asymmetrically. During the RIE, for example, a mask layer of a region in which there is a relatively small distance between the holes has a tendency to move backward relatively rapidly in a thickness direction, and a variation is generated in the upper surface height of the mask layer.

Such asymmetric erosion of the mask layer causes a tapered surface (facet) to be generated in a corner fronting on an opening (mask hole) of the mask layer, and the recoil of ions in an oblique direction on the tapered surface causes side etching of a memory hole to proceed. As a result, the shape of the memory hole is deteriorated, and thus it is likely to be difficult to form a memory hole having a high degree of roundness and a uniform size.

According to the embodiment, the second hole 72 is also formed in the stacked body 100 of the region at which the separation portion (source layer SL) is formed. That is, a plurality of first holes 71 and the plurality of second holes 72 are periodically arrayed over the entire region at which the memory cell array 1 is provided, with a pattern having a high symmetry. Therefore, the mask holes formed in the mask layer during RIE are also periodically arrayed with a pattern having a high symmetry, and thus asymmetric erosion of the mask layer can be suppressed.

Therefore, the side etching of the holes 71 and 72 due to recoil ions is suppressed, and thus etching can be caused to proceed in a direction substantially perpendicular to the main surface of the substrate 10. As a result, it is easy to form a memory hole (first hole 71) having a straight-shaped sidewall in which variation in diameter in a depth direction is suppressed. In the memory hole (first hole 71) having appropriate dimensions and an appropriate shape, variation in memory cell characteristics is suppressed.

Figure 5:
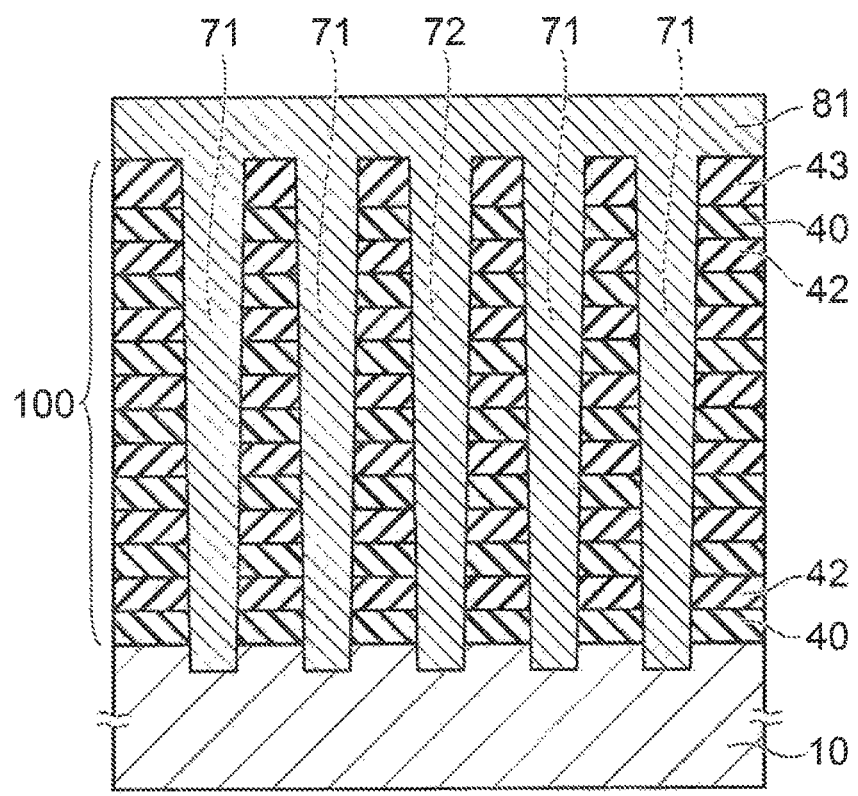
FIG. 5 is a schematic sectional view showing a method for manufacturing the semiconductor memory device of the embodiment.

After the first holes 71 and the second holes 72 are formed in the stacked body 100, a sacrificial film 81 is formed within the first holes 71 and the second holes 72 as shown in FIG. 5.

The material of the sacrificial film 81 is a material having etching selectivity with respect to the material of the stacked body 100. The material of the sacrificial film 81 is different from that of the stacked body 100. As the sacrificial film 81, for example, boron silicate glass (BSG) is buried within the first holes 71 and the second holes 72, and is formed on the stacked body 100.

After the sacrificial film 81 is formed, the sacrificial film 81 is moved backward and planarized until the uppermost layer (Insulating layer 43) of the stacked body 100 is exposed, for example, by an etch back method.

Figure 6A:
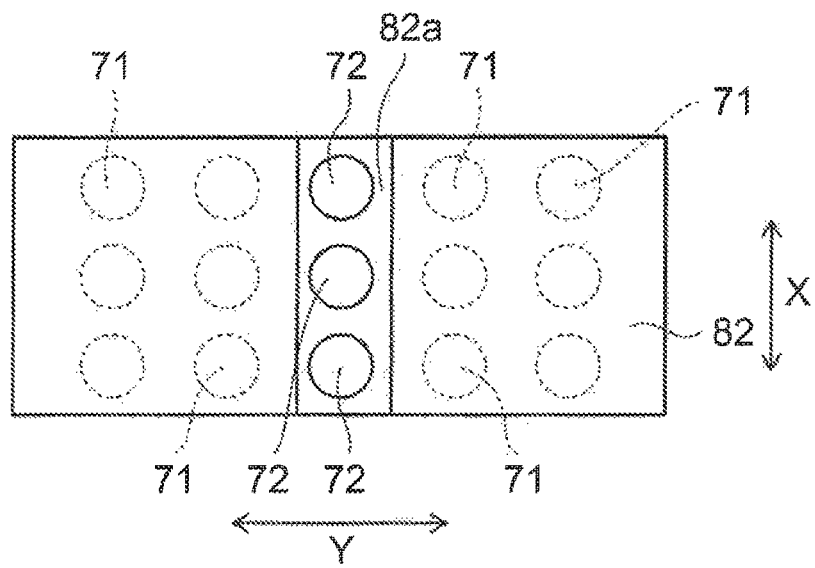
FIG. 6A is a schematic plan view showing a method for manufacturing the semiconductor memory device of the embodiment.
Figure 6B:
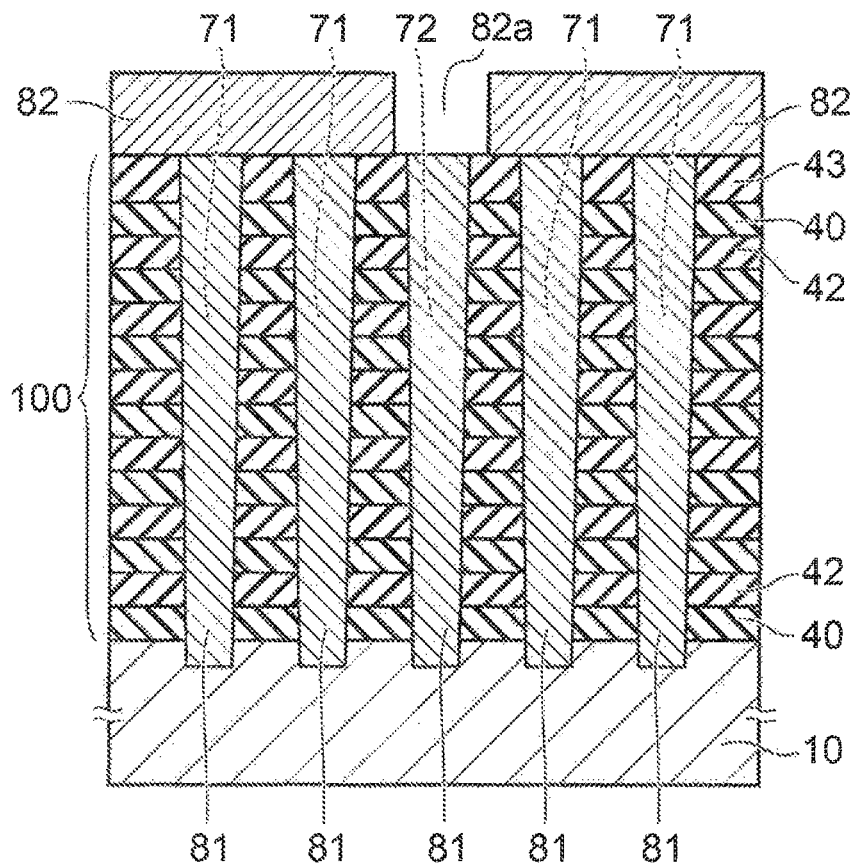
FIG. 6B is a schematic sectional view showing the method for manufacturing the semiconductor memory device of the embodiment.

Thereafter, as shown in FIGS. 6A and 6B, a mask 82 is formed on the stacked body 100. FIG. 6A corresponds to the top view of FIG. 6B. An X-direction and a Y-direction shown in FIG. 6A correspond to the X-direction and the Y-direction shown in FIG. 1, respectively.

The material of the mask 82 is a material having etching selectivity with respect to the material of the sacrificial film 81. The material of the mask 82 is different from that of the sacrificial film 81. The mask 82 is, for example, a TEOS film. A groove-shaped opening 82a extending, for example, in the X-direction is formed in the mask 82.

The mask 82 covers a region at which the columnar portion CL is provided. The mask 82 covers the sacrificial film 81 buried within the first holes 71. The upper end of the sacrificial film 81 buried within the second hole 72 of a region having the separation portion is exposed to the opening 82a without being covered with the mask 82.

The sacrificial film 81 buried within the second hole 72 is removed using this mask 82. For example, the sacrificial film 81 which is a BSG film is removed by vapor phase chromatography (VPC) processing using vapor phase HF.

Figure 7A:
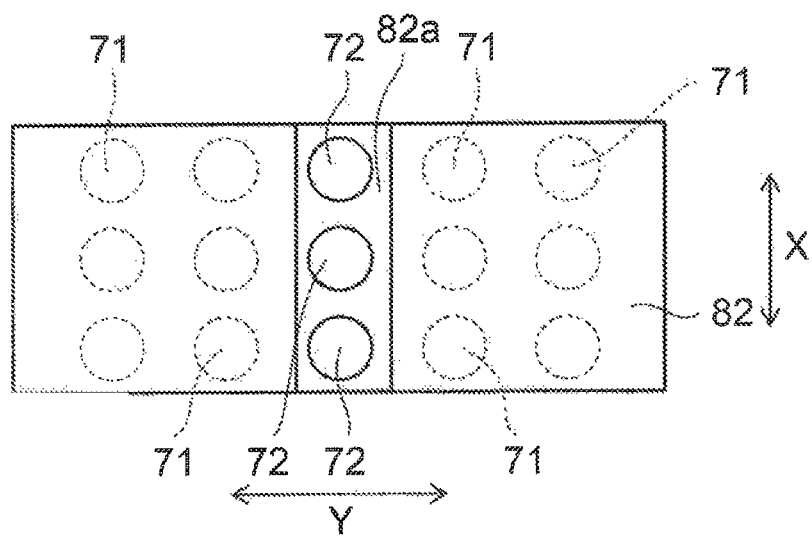
FIG. 7A is a schematic plan view showing a method for manufacturing the semiconductor memory device of the embodiment.
Figure 7B:
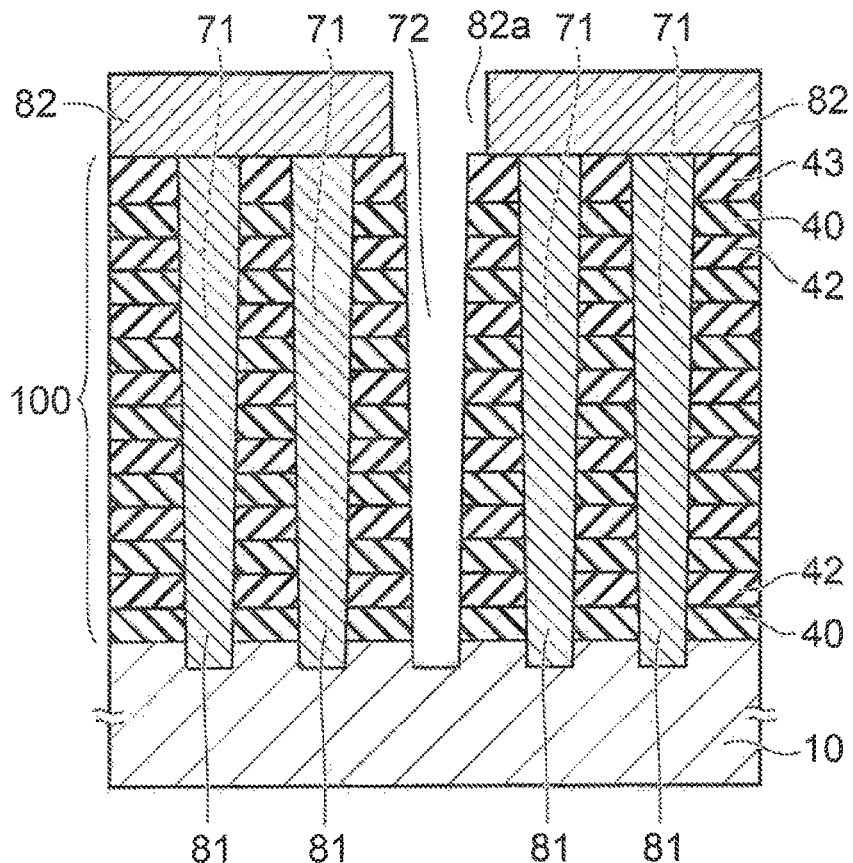
FIG. 7B is a schematic sectional view showing the method for manufacturing the semiconductor memory device of the embodiment.

The second hole 72 is exposed by the removal of the sacrificial film 81 within the second hole 72, as shown in FIGS. 7A and 7B. The sacrificial film 81 within the first hole 71 is covered with the mask 82 and is not removed.

FIG. 7A illustrates the top view of FIG. 7B. In addition, an X-direction and a Y-direction shown in FIG. 7A correspond to the X-direction and the Y-direction shown in FIG. 1, respectively.

Figure 8A:
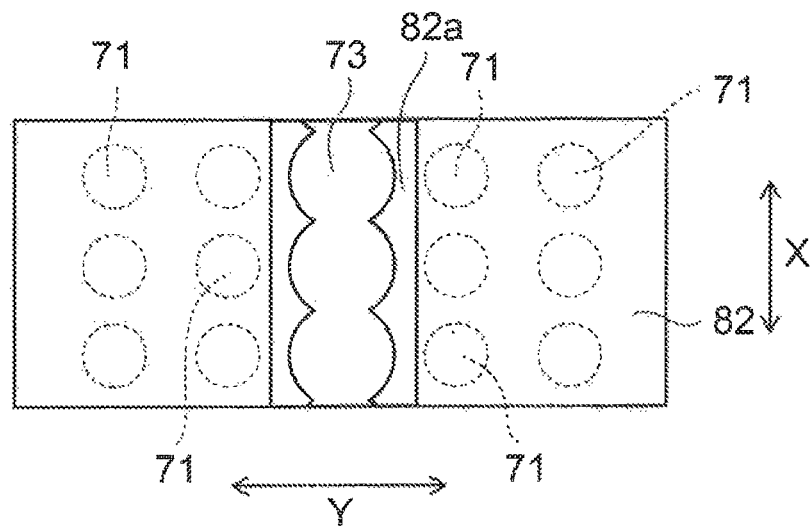
FIG. 8A is a schematic plan view showing a method for manufacturing the semiconductor memory device of the embodiment.
Figure 8B:
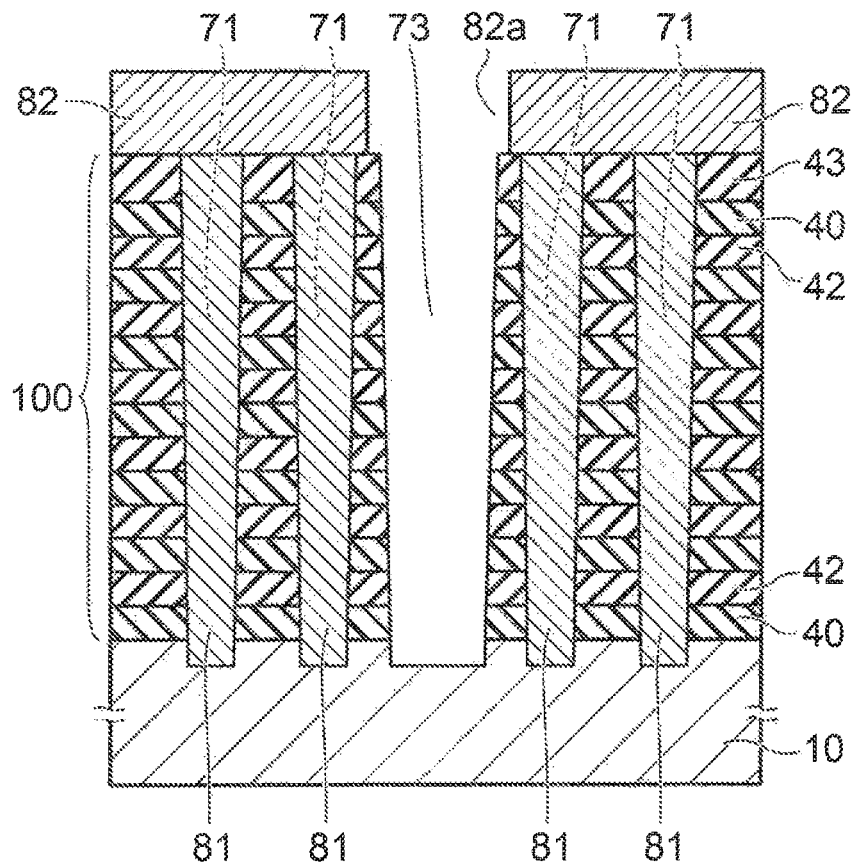
FIG. 8B is a schematic sectional view showing the method for manufacturing the semiconductor memory device of the embodiment.

In a state where the mask 82 is left on the stacked body 100, a portion of the stacked body 100 between the second holes 72 next to each other is etched. At least two or more second holes 72 are connected to each other, and a groove (trench) 73 is formed as shown in FIGS. 8A and 8B. FIG. 8A illustrates, for example, an example in which a plurality of second holes 72 are connected to each other in the X-direction, and the groove 73 extending in the X-direction is formed.

FIG. 8A corresponds to the top view of FIG. 8B. In addition, an X-direction and a Y-direction shown in FIG. 8A correspond to the X-direction and the Y-direction shown in FIG. 1, respectively.

For example, the portion of the stacked body 100 between the second holes 72 next to each other is isotropically etched by a wet etching method. An etching solution is supplied into the second holes 72, and the sidewalls of the second holes 72 are side-etched so as to increase the hole diameter of the second hole 72. As the etching solution in this case, for example, a dilute hydrofluoric acid aqueous solution (DHF) is used in silicon oxide layers (insulating layers 40 and 43), and a heated phosphoric acid aqueous solution is used in a silicon nitride layer (sacrificial layer 42).

The portion of the stacked body 100 between the plurality of second holes 72 is side-etched from a plurality of directions. For example, in the example shown in FIG. 7A, the portion of the stacked body 100 interposed between two second holes 72 in the X-direction is side-etched from two directions. On the other hand, another portion of the stacked body 100 between the second hole 72 and the first hole 71 is side-etched from one direction from the second hole 72 side.

For this reason, the portion of the stacked body 100 between the plurality of second holes 72 is etched in a transverse direction more rapidly than the other portion of the stacked body 100 between the second hole 72 and the first hole 71. Alternatively, a distance between the second hole 72 and the first hole 71 is made to be larger than a distance between the second holes 72. Thereby, before a portion of the stacked body 100 between the sidewall of the groove 73 and the sacrificial film 81 within the first hole 71 is completely lost, the plurality of second holes 72 are connected to each other, and the groove 73 is formed. The sidewall of the groove 73 does not reach the sacrificial film 81 within the first hole 71. An etching time is controlled so that the portion of the stacked body 100 are left between the sidewall of the groove 73 and the sacrificial film 81 within the first hole 71.

The bottom of the groove 73 reaches the substrate 10. The groove 73 may be able to separate the stacked body 100 into a plurality of blocks, and the sidewall of the groove 73 may not have a shape extending linearly in the X-direction. As shown in FIG. 8A, the shape of the sidewall of the groove 73 may be formed in a curved shape.

The plurality of second holes 72 are connected to each other by increasing the hole diameter of the second hole 72. Therefore, the sidewall of the groove 73 has a tendency to have a shape in which the outer shape (outline) of the second hole 72 is reflected. In the example shown in FIG. 8A, concavity and convexity repeated along the X-direction are formed on the sidewall of the groove 73. The groove 73 extends along the X-direction. Concave portions of the concavity and convexity reflect the outer shape (outline) of the second hole 72, and have a curvature.

The minimum width (distance between convex portions on the sidewall) of the groove 73 is larger than the diameter of the first hole 71. Therefore, the minimum width of the separation portion including the source layer SL and the insulating film 63 shown in FIG. 19 is larger than the diameter of the columnar portion CL including the channel film 20 and the memory film 30.

In addition, the portion of the stacked body 100 between the plurality of holes 72 can also be removed by a dry etching method. For example, the sidewall of the second hole 72 is side-etched so as to increase the hole diameter of the second hole 72 by an etching gas supplied into the second hole 72. As the etching gas in this case, for example, gas containing a fluorocarbon or hydrofluorocarbon, such as $CF_4$ is used.

In addition, the portion of the stacked body 100 between the second holes 72 can also be removed by anisotropic etching having strong etching directivity in a direction toward the substrate 10.

Depending on the etching select ratio of the substrate 10 to the etching gas, it is preferable to control dry etching conditions so that the sidewall of the second hole 72 is side-etched while protecting the substrate 10 at the bottom of the second hole 72 by depositing a film on the bottom of the second hole 72.

When the sidewall of the second hole 72 is isotropically side-etched by the etching solution or the etching gas supplied into the second hole 72, the portion of the stacked body 100 between the second holes 72 can be removed more rapidly than in a case where the portion of the stacked body 100 is anisotropically etched from above.

When the stacked body 100 is removed by isotropic etching, the etching solution or the etching gas may be able to supply into the second hole 72, and thus high-accuracy positioning between the opening 82a of the mask 82 and the second hole 72 is not required. High-accuracy patterning of the mask 82 is not required.

The groove 73 extends in the X-direction, and the stacked body 100 is separated into a plurality of blocks in the Y-direction. The source layer SL is formed within the groove 73 with the insulating film 63 interposed between the stacked body 100 and the source layer SL, by a process described later.

According to the embodiment, the groove 73 of the separation portion is formed using the second hole 72 which is simultaneously formed when the memory hole (first hole 71) is formed. For this reason, there is no need for a RIE process for forming a groove in the separation portion using a mask layer high-accuracy patterned before or after forming the memory holes (first holes 71). Therefore, cost reduction can be made in connection with reductions in processing man-hours and processing time with respect to the stacked body 100.

Figure 9:
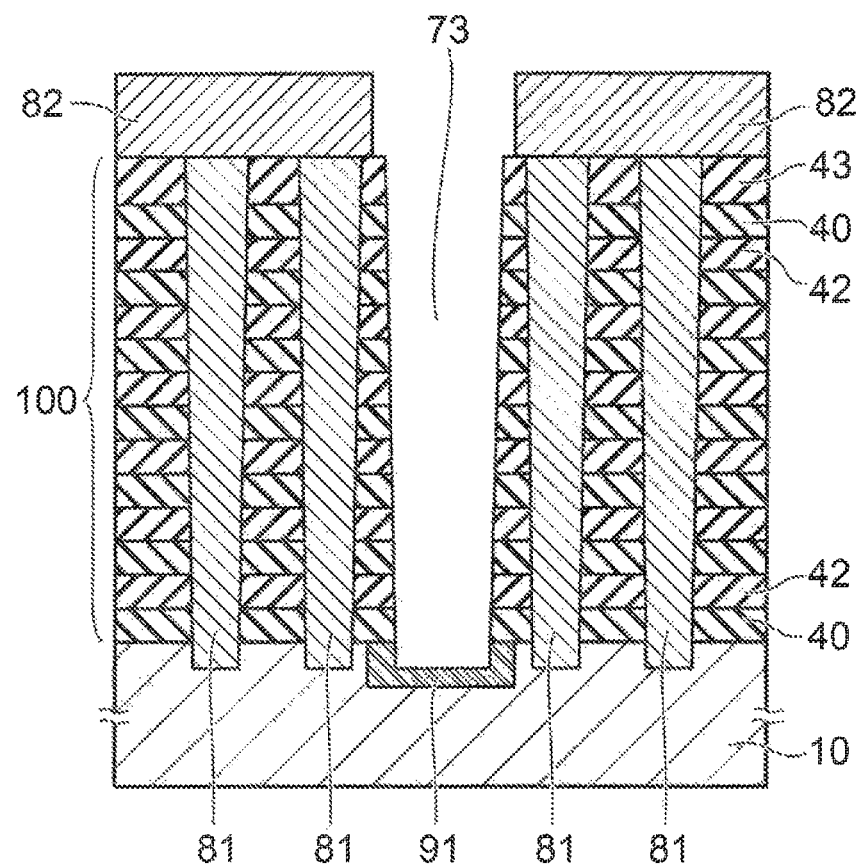

After the groove 73 is formed, impurities are implanted into the surface of the substrate 10 at the bottom of the groove 73. The implanted impurities are diffused by heat treatment, and a contact region 91 is formed in the surface of the substrate 10 at the bottom of the groove 73, as shown in FIG. 9.

Figure 10:
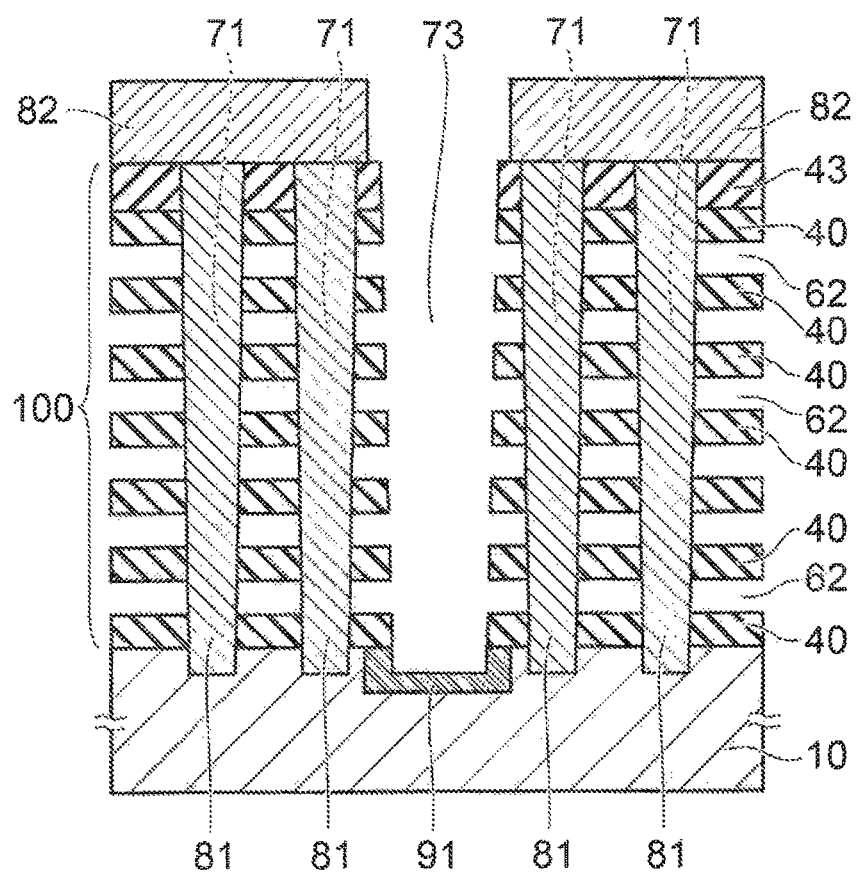

Next, the sacrificial layer 42 of the stacked body 100 is removed by etching through the groove 73. A space 62 is formed between the insulating layers 40 by the removal of the sacrificial layer 42, as shown in FIG. 10.

Figure 11:
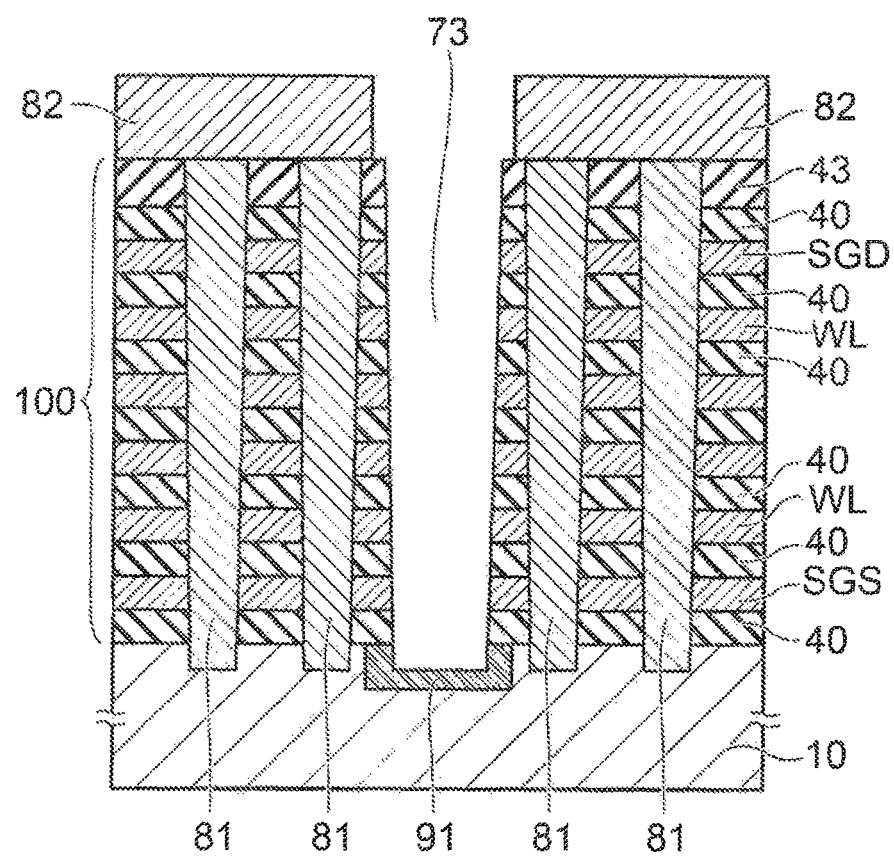

The electrode layer WL, the drain side select gate SGD, and the source side select gate SGS are formed in the space 62 through the groove 73, as shown in FIG. 11. The drain side select gate SGD is formed in the uppermost space 62, the source side select gate SGS is formed in the lowermost space 62, and the electrode layer WL is formed in the space 62 between the uppermost space and the lowermost space.

The electrode layer WL, the drain side select gate SGD, and the source side select gate SGS are metal layers, and include, for example, tungsten.

After the electrode layer WL, the drain side select gate SGD, and the source side select gate SGS are formed, the separation portion is formed within the groove 73.

Figure 12:
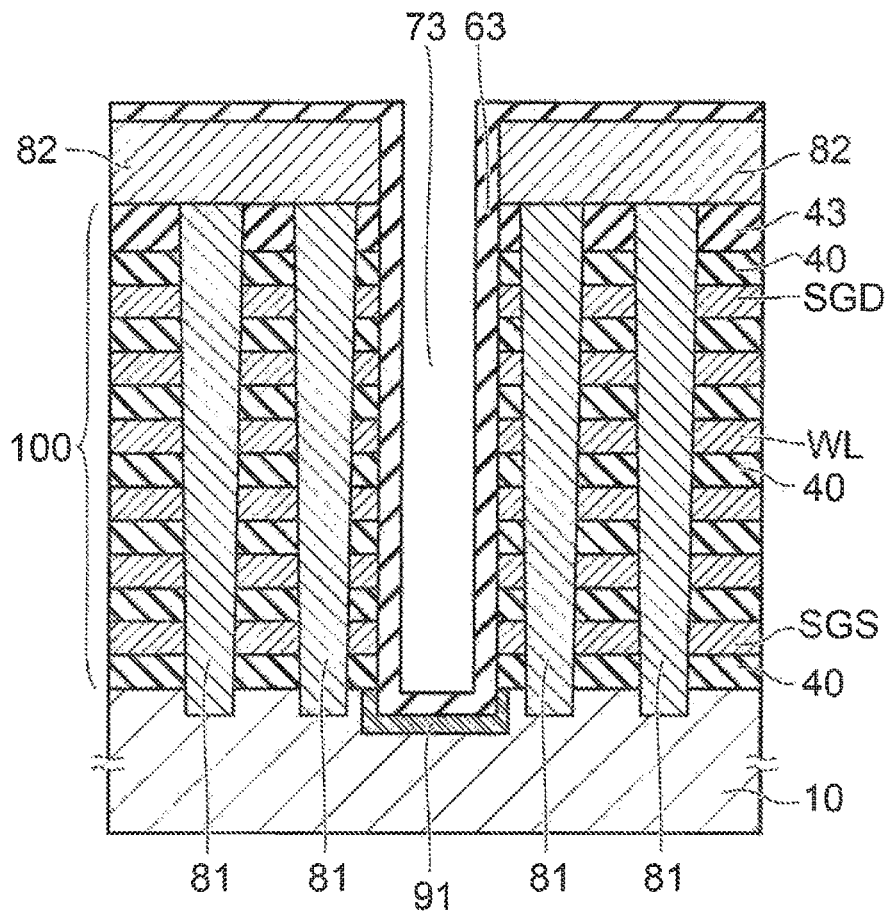

First, the insulating film 63 is conformally formed on the sidewall and the bottom of the groove 73, as shown in FIG. 12. The insulating film 63 formed on the bottom of the groove 73 is removed by an RIE method, and the contact region 91 is exposed at the bottom of the groove 73.

Figure 13:
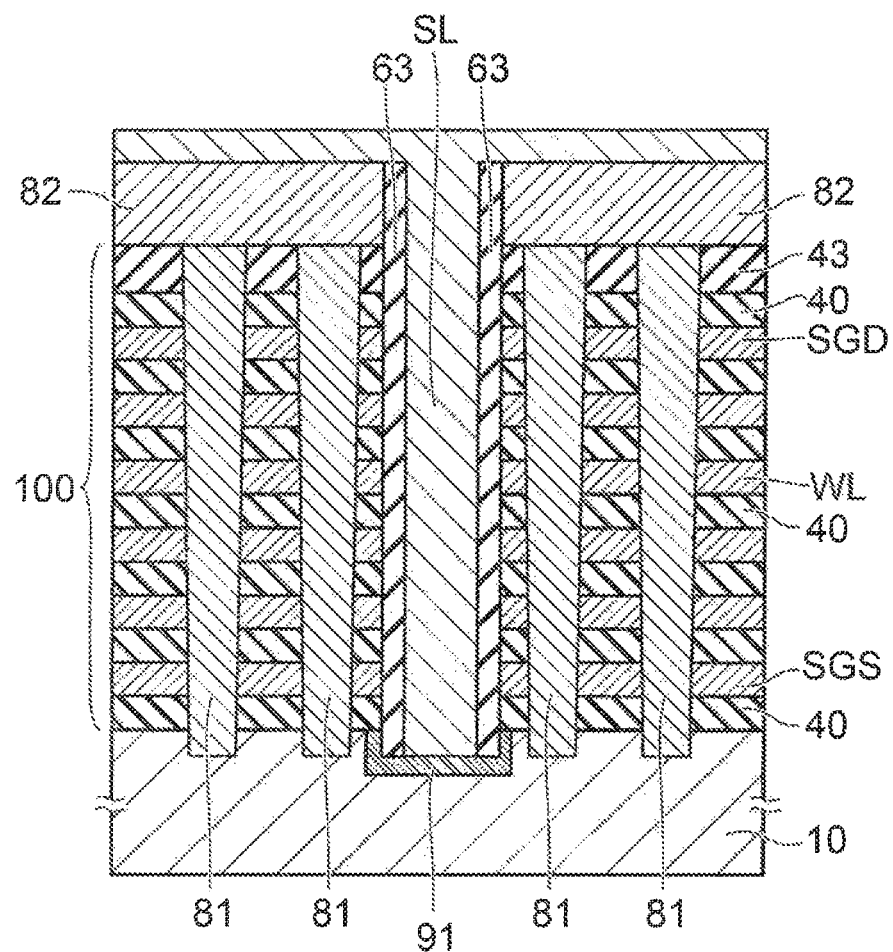

Thereafter, a conductive material is buried inside the insulating film 63 in the groove 73, and the source layer SL is formed as shown in FIG. 13. The lower end of the source layer SL is in contact with the contact region 91.

After the source layer SL is formed, the source layer SL on the mask 82 is removed by a Chemical Mechanical Polishing (CMP) method or an etch back method, and the upper surface of the mask 82 is exposed. Thereafter, the mask 82 is removed.

The upper end of the sacrificial film 81 within the first hole 71 is exposed by the removal of the mask 82. The sacrificial film 81 within the first hole 71 is removed. Similarly to the case where the sacrificial film 81 within the second hole 72 is removed, the sacrificial film 81 which is a BSG film is removed by a VPC process using, for example, vapor phase HF.

Figure 14:
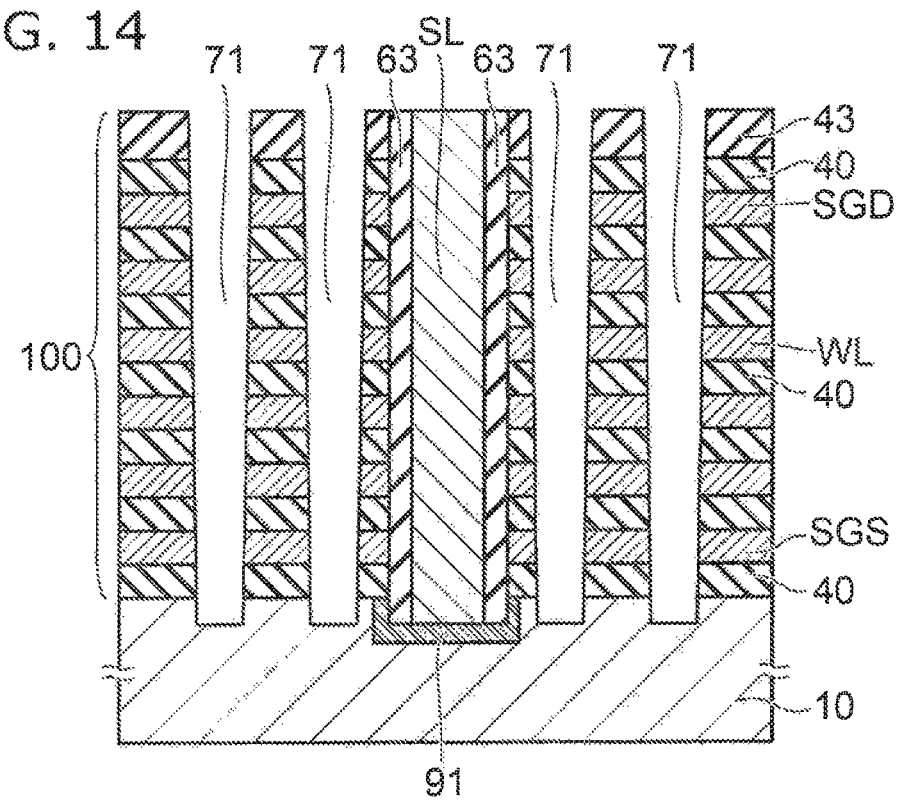
Figure 15:
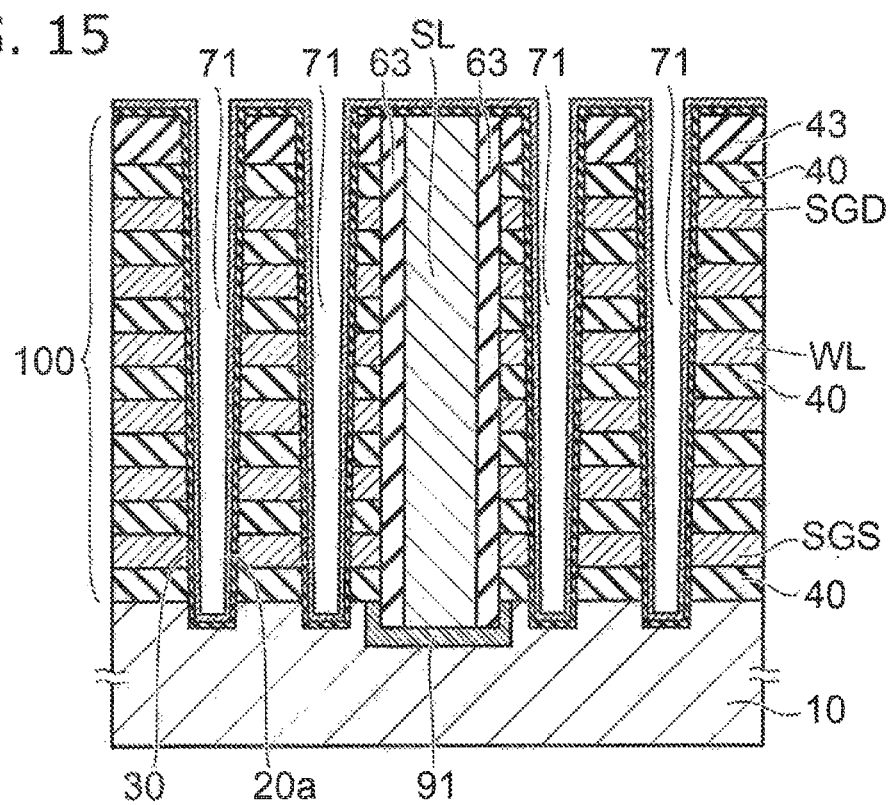

The first hole 71 appears by the removal of the sacrificial film 81 within the first hole 71, as shown in FIG. 14. The memory film 30 is formed on the inner wall (sidewall and bottom) of the first hole 71, as shown in FIG. 15, and a cover film 20a is formed inside the memory film 30.

Figure 16:
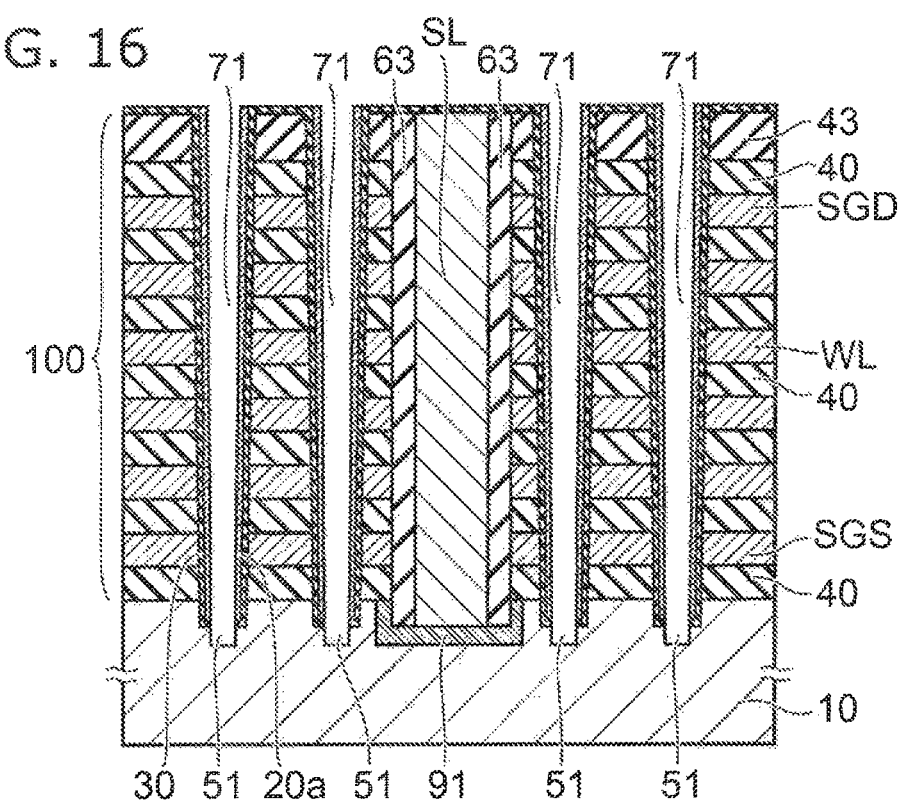

The cover film 20a and the memory film 30 formed on the bottom of the first hole 71 are removed by an RIE method, and a contact hole 51 is formed at the bottom of the first hole 71, as shown in FIG. 16. The substrate 10 is exposed at the side surface and the bottom surface of the contact hole 51.

During the RIE for forming the contact hole 51, the memory film 30 formed on the sidewall of the first hole 71 is covered with the cover film 20a and is protected by the cover film 20a. The memory film 30 formed on the sidewall of the first hole 71 is not damaged by the RIE.

Figure 17:
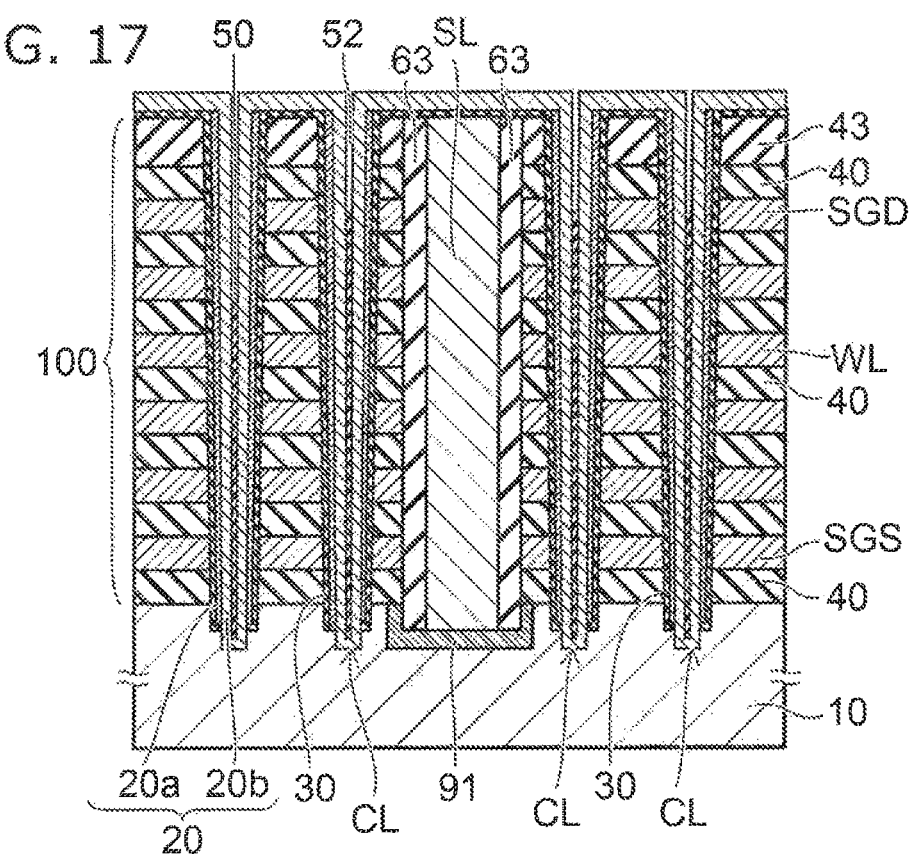

Next, a channel film 20b is formed in the contact hole 51 and inside the cover film 20a, as shown in FIG. 17. The cover film 20a and the channel film 20b are formed as, for example, amorphous silicon films, and are crystallized to polycrystalline silicon films by annealing. The cover film 20a constitutes a portion of the above-mentioned channel film 20 together with the channel film 20b.

The channel film 20 is electrically connected to the substrate 10 through the channel film 20b formed in the contact hole 51. Therefore, the channel film 20 is electrically connected to the source layer SL through the substrate 10 and the contact region 91.

The core insulating film 50 is formed inside the channel film 20b as shown in FIG. 17, and the columnar portion CL is formed thereby. The upper portion of the core insulating film 50 is etched back, and a hollow 52 is formed in the upper portion of the columnar portion CL.

Figure 18:
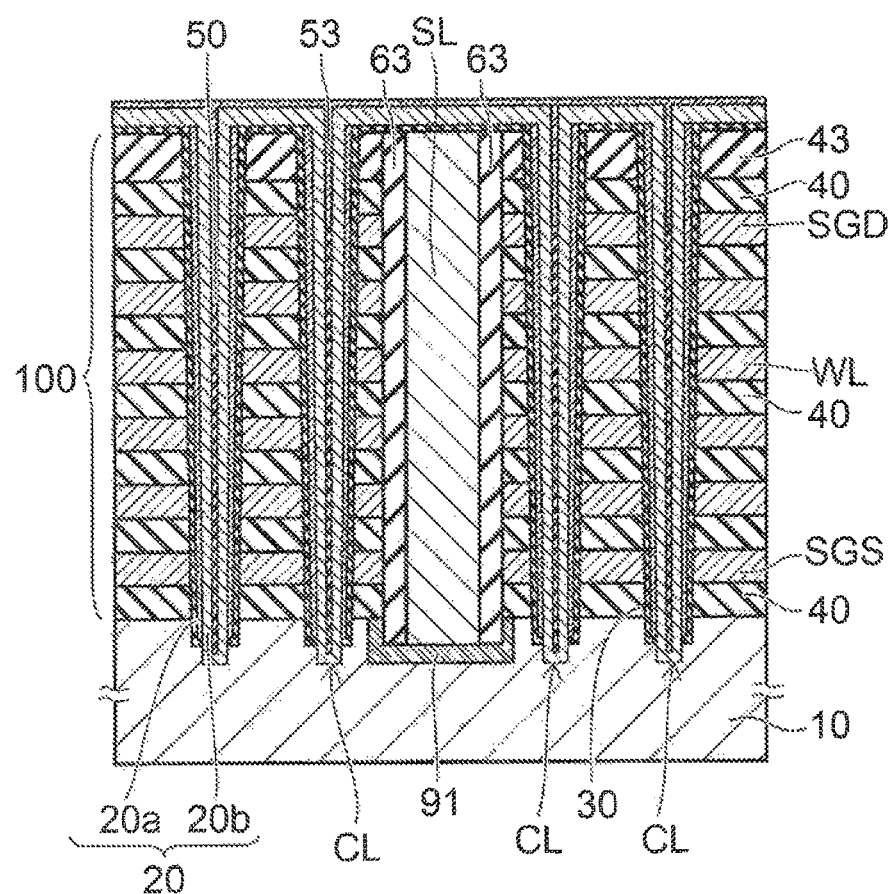

As shown in FIG. 18, a semiconductor film 53 is buried in the hollow 52. The semiconductor film 53 is, for example, a doped silicon film, and has an impurity concentration higher than that of the channel film 20 which is a non-doped silicon film.

In a general charge injection type memory, electrons stored in a charge storage layer such as a floating gate are extracted by boosting a substrate potential, and data is erased.

In addition, as another erasure method, there is also a method of boosting the channel potential of the memory cell using a Gate Induced Drain Leakage (GIDL) current which is generated in a channel on the upper end of the drain side select gate.

In this embodiment, holes are generated by giving a high electric field to the semiconductor film 53 having a high impurity concentration and provided in the vicinity of the upper end of the drain side select gate SGD. The holes are supplied to the channel film 20 to thereby boost the channel potential. By setting the potential of the electrode layer WL to, for example, a ground potential (0 V), electrons of the charge storage film 32 are extracted by a potential difference between the channel film 20 and the electrode layer WL, or holes are injected into the charge storage film 32, and thus an erasure operation of data is performed.

After the semiconductor film 53 is buried in the hollow 52, the memory film 30, the channel film 20, and the semiconductor film 53 deposited on the upper surface of the stacked body 100 (upper surface of the insulating layer 43) are removed and planarized by a Chemical Mechanical Polishing (CMP) method or an etch back method. Thereafter, an insulating layer 92 is formed on the stacked body 100, as shown in FIG. 19. The insulating layer 92 is, for example, a silicon oxide layer (TEOS layer).

Thereafter, the drain side select gate SGD is separated in the Y-direction as shown in FIG. 1. Further, the bit line BL shown in FIG. 1, and an upper-layer interconnect connected to the source layer SL are formed.

FIG. 20A to FIG. 22D are schematic plan views illustrating an arrangement example of the first holes 71, the second holes 72, and the groove 73. The second holes 72 before forming the groove 73 are indicated by broken lines.

In FIGS. 20A and 20B, and FIGS. 21A and 21B, the plurality of first holes 71 and the plurality of second holes 72 are disposed, for example, in a square lattice in the X-direction and the Y-direction.

FIG. 20A illustrates an example in which a certain row of the second holes 72 arranged in the X-direction are connected to each other and the grooves 73 are formed. The second holes 72 next to each other in the X-direction are connected to each other by increasing a hole diameter. In addition, as shown in FIG. 20B, the grooves 73 extending in the X-direction may be formed so as to be next to each other in the Y-direction.

In FIGS. 20A and 20B, since a distance between the second hole 72 and the first hole 71 which are next to each other in the Y-direction is larger than a distance between the second holes 72 which are next to each other in the X-direction, the second hole 72 and the first hole 71 are not connected to each other in the Y-direction, and the sidewall of the groove 73 does not reach the first hole 71.

Figure 21A:
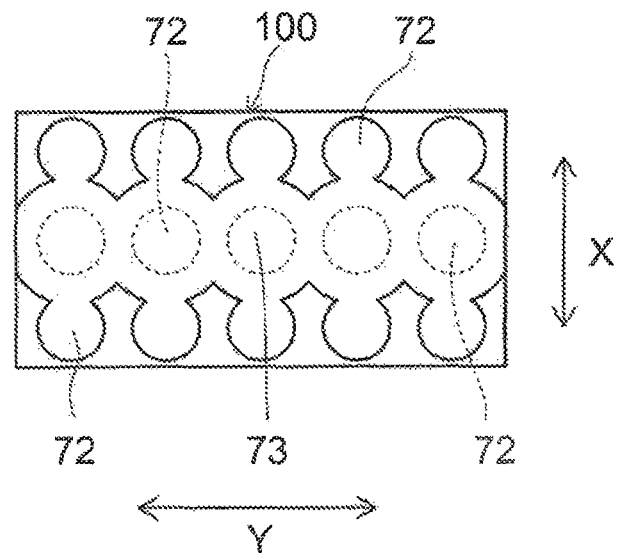
Figure 21B:
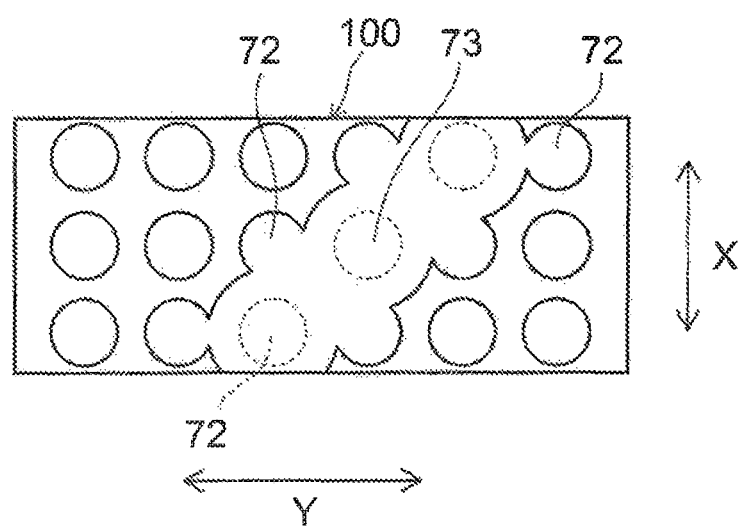

As shown in FIG. 1, the Y-direction is defined as a direction in which the bit line BL extends, and the X-direction is defined as a direction orthogonal to the Y-direction. The extending direction of the groove 73 is not limited to the X-direction, and may be the Y-direction as shown in FIG. 21A. In addition, as shown in FIG. 21B, the groove 73 may extend in a direction oblique to the X-direction and the Y-direction.

Figure 22A:
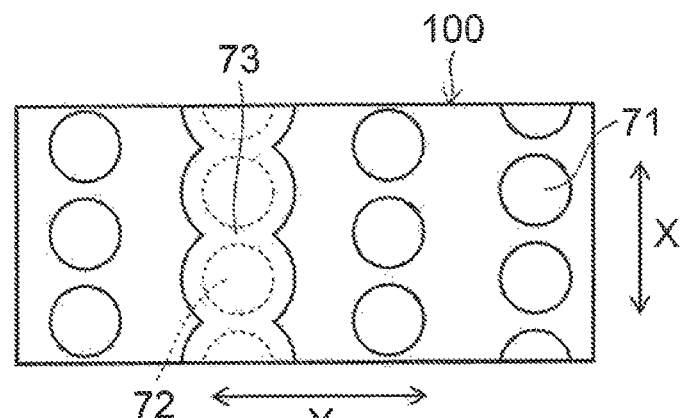
Figure 22B:
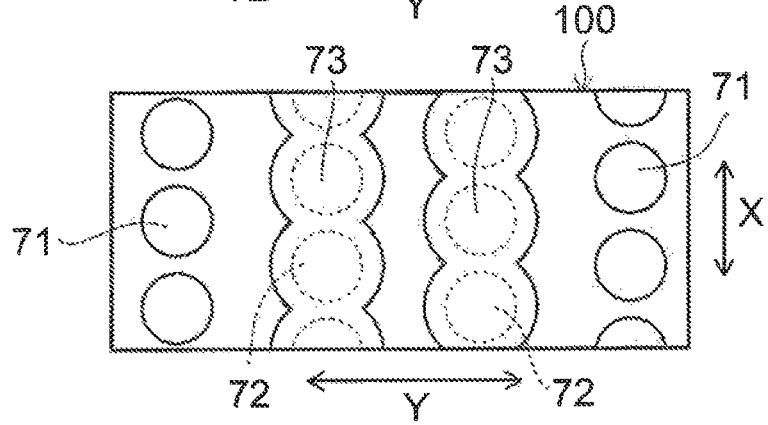

In FIGS. 22A and 22B, the plurality of first holes 71 and the plurality of second holes 72 are disposed in a houndstooth pattern.

FIG. 22A illustrates an example in which the second holes 72 next to each other in the X-direction are connected to each other by increasing a hole diameter, and one row of the grooves 73 extending in the X-direction are formed. FIG. 22B illustrates an example in which two rows of such grooves 73 extending in the X-direction are formed so as to be next to each other in the Y-direction.

In FIGS. 22A and 22B, since a pitch in the Y-direction between the second hole 72 and the first hole 71 is larger than a pitch in the X-direction between the second holes 72, the second hole 72 and the first hole 71 are not connected to each other in the Y-direction, and the sidewall of the groove 73 does not reach the first hole 71.

Figure 22C:
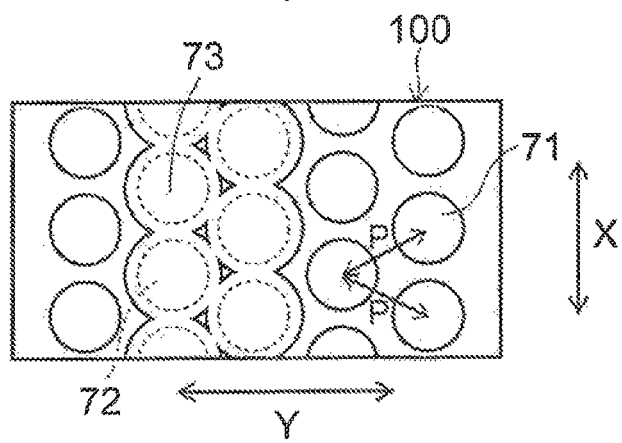
Figure 22D:
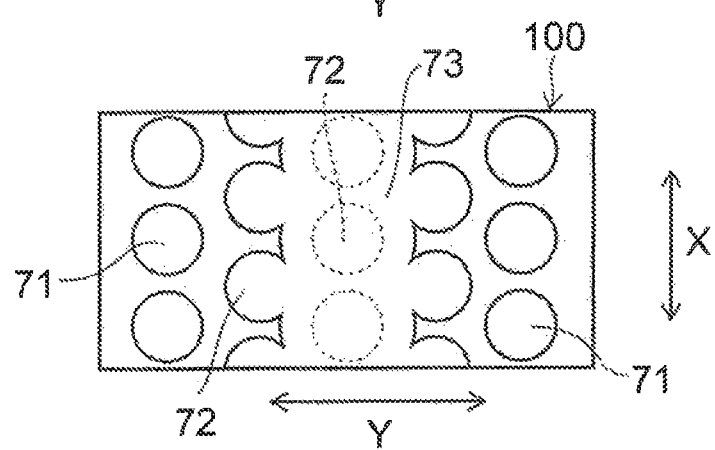

In FIGS. 22C and 22D, the plurality of first holes 71 and the plurality of second holes 72 are arranged in a houndstooth pattern. A pitch in the X-direction of the first and second holes 71, 72, and a pitch P in an oblique direction of the first and second holes 71, 72 are equal. A pitch in the Y-direction of the first and second holes 71, 72 is equal to $X(\sqrt{3})/2$.

In FIG. 22C, the groove 73 extends in the X-direction. The groove 73 has a width at which two second holes 72 are connected to each other in the Y-direction. In FIG. 22D, the groove 73 extends in the X-direction. The groove 73 has a width at which three second holes 72 are connected to each other in the Y-direction. The sidewall of the groove 73 may not be linear as described above.

Figure 23:
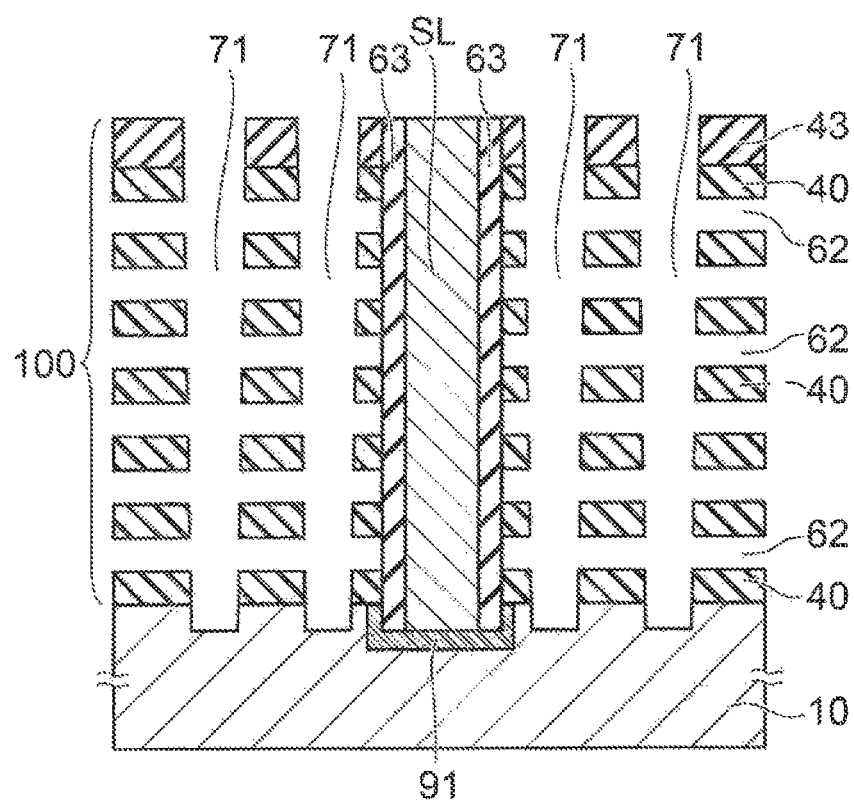

Until the process of exposing the first hole 71 shown in FIG. 14 described above, the replacement of the sacrificial layer 42 by the electrode layer WL may not be performed, and the sacrificial layer 42 may be removed by etching through the first hole 71, as shown in FIG. 23.

Figure 24:
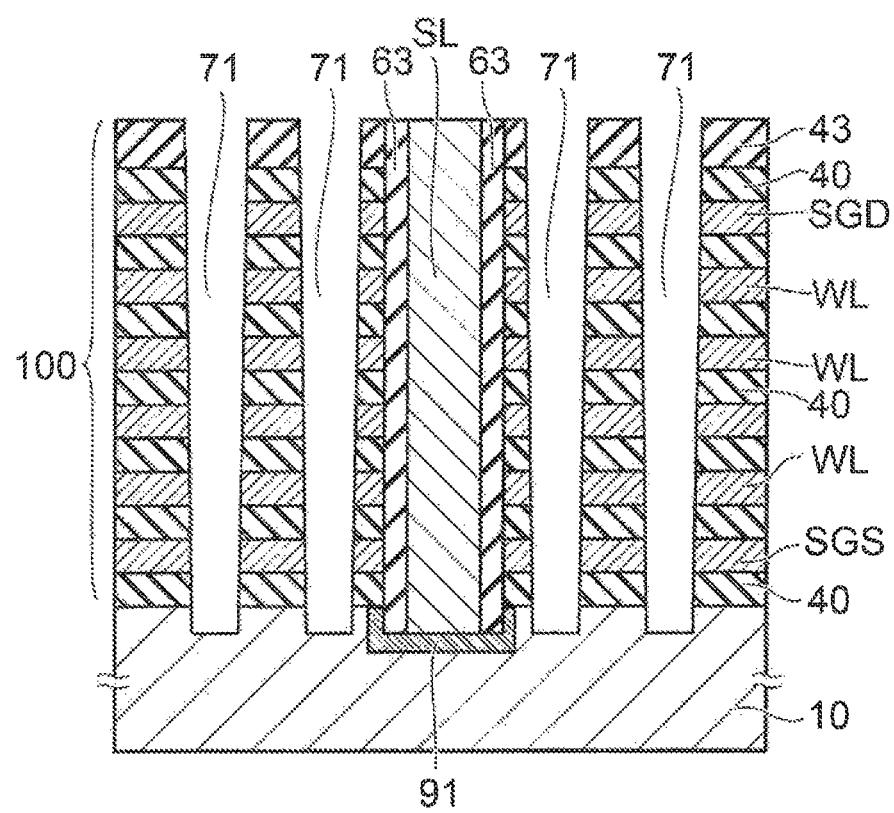

A metal layer is formed in the space 62 formed by the removal of the sacrificial layer 42 through the first hole 71, and the electrode layer WL, the drain side select gate SGD, and the source side select gate SGS are formed as shown in FIG. 24.

A conductive layer (for example, impurity-doped silicon layer or metal layer) instead of the sacrificial layer 42, and the insulating layer 40 may be alternately stacked on the substrate 10. The conductive layers are left as the electrode layer WL, the drain side select gate SGD, and the source side select gate SGS.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
a stacked body including a plurality of electrode layers stacked with insulators interposed between the electrode layers, the electrode layers including at least a first electrode layer and a second electrode layer provided below the first electrode layer, the first electrode layer functioning a control gate of a memory cell and the second electrode layer functioning a control gate of a select transistor;
a plurality of separation portions each extending in a stacking direction of the stacked body and in a first direction intersecting the stacking direction and separating the stacked body in a second direction intersecting the stacking direction and the first direction, the separation portions including a first separation portion disposed between a first portion and a second portion of the stacked body and a second separation portion disposed between the first portion and a third portion of the stacked body, the first portion and the second portion having a pair of first sidewalls facing each other with the first separation portion interposed, the first portion and the third portion having a pair of second sidewalls facing each other with the second separation portion interposed, and at least the first electrode layer included in the stacked body being not separated in the second direction inside the first portion of the stacked body; and
a plurality of columnar portions each penetrating through the electrode layers in the stacking direction and including a semiconductor film extending in the stacking direction and a cylindrical film provided between the electrode layers and the semiconductor film, the columnar portions including a first columnar portion, a second columnar portion and a third columnar portion each extending inside the first portion of the stacked body, the first columnar portion and the second columnar portion being arranged in the first direction, and the first columnar portion and the third columnar portion being arranged in the second direction,
a width in the second direction between the pair of first sidewalls and a width in the second direction between the pair of second sidewalls both being larger than diameters of the columnar portions,
the pair of the first sidewalls and the pair of the second sidewalls each having shapes in which a plurality of concave portions are disposed on both sides along the first direction, the concave portions being arranged periodically in the first direction.

2. The device according to claim 1, wherein the concave portions have curvature.

3. The device according to claim 1, wherein the pair of the first sidewalls and the pair of the second sidewalls have shapes in which each of the concave portions extends in the stacking direction.

4. The device according to claim 3, wherein the concave portions have curvature of substantially same radius each other at a same level in the stacking direction.

5. The device according to claim 1, further comprising a underlying silicon portion below the stacked body, lower ends of a first semiconductor film, a second semiconductor film and a third semiconductor film being connected to the underlying silicon portion in common, the first semiconductor film, the second semiconductor film and the third semiconductor film being respectively included in the first columnar portion, the second columnar portion and the third columnar portion.

6. A semiconductor memory device comprising:
a stacked body including a plurality of electrode layers stacked with insulators interposed between the electrode layers, the electrode layers including at least a first electrode layer and a second electrode layer provided below the first electrode layer, the first electrode layer functioning a control gate of a memory cell and the second electrode layer functioning a control gate of a select transistor;
a separation portion extending in a stacking direction of the stacked body and in a first direction intersecting the stacking direction and separating the stacked body into a first portion and a second portion of the stacked body in a second direction intersecting the stacking direction and the first direction, the separation portion being disposed between the first portion and the second portion of the stacked body, the first portion and the second portion having a pair of sidewalls facing each other with the separation portion interposed; and
a plurality of columnar portions each penetrating through the electrode layers in the stacking direction and including a semiconductor film extending in the stacking direction and a cylindrical film provided between the electrode layers and the semiconductor film,
the sidewalls having shapes in which a plurality of concave portions are disposed in the first direction on the first portion side and on the second portion side respectively, the concave portions on the first portion side and the concave portions on the second portion side being arranged in the first direction respectively in a same pitch as the columnar portions arranged in the first direction adjacent to the separation portion.

7. The device according to claim 6, wherein
a width in the second direction between the pair of sidewalls is larger than diameters of the columnar portions.

8. The device according to claim 7, wherein
the concave portions include a plurality of first concave portions disposed at a sidewall on the first portion side and a plurality of second concave portions disposed at a sidewall on the second portion side, and
the first concave portions and the second concave portions have asymmetric positional relationship in the first direction with respect to a central axis of the separation portion along the first direction.

9. The device according to claim 6, wherein
the concave portions include a plurality of first concave portions disposed at a sidewall on the first portion side and a plurality of second concave portions disposed at a sidewall on the second portion side, and
the columnar portions include a plurality of first columnar portions provided in the first portion of the stacked body and adjacent to the separation portion and a plurality of second columnar portions provided in the second portion of the stacked body and adjacent to the separation portion.

10. The device according to claim 9, wherein
the first columnar portions are arranged in a position relationship with a half pitch shifted in the first direction from the first concave portions and the second columnar portions are arranged in a position relationship with a half pitch shifted in the first direction from the second concave portions.

11. The device according to claim 6, wherein the concave portions have curvature.

12. The device according to claim 6, wherein the first sidewalls have shapes in which each of the concave portions extends in the stacking direction.

13. The device according to claim 12, wherein the concave portions disposed on the first portion side and on the second portion side have curvature of substantially same radius at a same level in the stacking direction.

14. The device according to claim 6, wherein the columnar portions are arranged in a staggered arrangement in the stacked body.

15. The device according to claim 14, further comprising a underlying silicon portion below the stacked body, lower ends of semiconductor films included in the columnar portions being connected to the underlying silicon portion in common.

16. A semiconductor memory device comprising:
a stacked body including a plurality of electrode layers stacked with insulators interposed between the electrode layers, the electrode layers including at least a first electrode layer and a second electrode layer provided below the first electrode layer, the first electrode layer functioning a control gate of a memory cell and the second electrode layer functioning a control gate of a select transistor;
a plurality of columnar portions arranged in a staggered arrangement so as to penetrate through the electrode layers in a stacking direction of the stacked body, each of the columnar portions including a semiconductor film extending in the stacking direction and a cylindrical film provided between the electrode layers and the semiconductor film; and
a separation portion extending in the stacking direction and in a first direction intersecting the stacking direction, and separating the stacked body into a first portion and a second portion of the stacked body in a second direction intersecting the stacking direction and the first direction, the separation portion being disposed between the first portion and the second portion of the stacked body so that the first portion and the second portion have a pair of sidewalls facing each other with the separation portion interposed,
the pair of sidewalls including a sidewall on the first portion side and a sidewall on the second portion side,
a plurality of first concave portions being disposed at the sidewall on the first portion side along the first direction, a plurality of second concave portions being disposed at the sidewall on the second portion side along the first direction, and
the first concave portions and the second concave portions having asymmetric positional relationship in the first direction with respect to a central axis of the separation portion along the first direction.

17. The device according to claim 16, wherein
the columnar portions include a plurality of first columnar portions and a plurality of second columnar portions, the first columnar portions being arranged in the first direction adjacent to the separation portion in the first portion of the stacked body, the second columnar portions being arranged in the first direction adjacent to the separation portion in the second portion of the stacked body,
the first columnar portions are arranged in a position relationship with a half pitch shifted in the first direction from the first concave portions disposed at the sidewall on the first portion side, and the second columnar portions are arranged in a position relationship with a half pitch shifted in the first direction from the second concave portions disposed at the sidewall on the second portion side.

18. The device according to claim 17, wherein the first concave portions are arranged at positions corresponding to the second columnar portions in the first direction, and the second concave portions are arranged at positions corresponding to the first columnar portions in the first direction.

19. The device according to claim 16, wherein positions in the first direction of the first concave portions are shifted with a half pitch from positions in the first direction of the second concave portions.

20. The device according to claim 16, wherein the first concave portions and the second concave portions have curvature.

* * * * *